United States Patent [19]
Nakamori

[11] Patent Number: 5,965,868
[45] Date of Patent: Oct. 12, 1999

[54] LASER LIGHT QUANTITY CONTROL DEVICE

[75] Inventor: Tomohiro Nakamori, Shizuoka-ken, Japan

[73] Assignee: Canon Kabushiki Kaisha, Tokyo, Japan

[21] Appl. No.: 08/838,154

[22] Filed: Apr. 15, 1997

[30] Foreign Application Priority Data

Apr. 16, 1996 [JP] Japan .................................. 8-094230

[51] Int. Cl.⁶ ..................................................... H01S 3/10
[52] U.S. Cl. ........................................... 250/205; 372/31
[58] Field of Search ............................... 250/205; 372/31

[56] References Cited

U.S. PATENT DOCUMENTS

| | | | |
|---|---|---|---|
| 4,796,265 | 1/1989 | Asada et al. ............................... | 372/31 |
| 4,931,882 | 6/1990 | Takeda et al. ............................ | 358/474 |
| 5,130,524 | 7/1992 | Egawa et al. ............................. | 250/205 |
| 5,517,151 | 5/1996 | Kubota ..................................... | 327/514 |
| 5,600,126 | 2/1997 | Appel et al. .............................. | 250/205 |
| 5,659,414 | 8/1997 | Appel et al. .............................. | 359/196 |
| 5,734,170 | 3/1998 | Ikeda ........................................ | 250/551 |

*Primary Examiner*—Edward P. Westin
*Assistant Examiner*—Thanh X. Luu
*Attorney, Agent, or Firm*—Fitzpatrick, Cella, Harper & Scinto

[57] ABSTRACT

A laser light quantity control device includes a semiconductor laser element having a plurality of light emitting portions and a light quantity detector for detecting light quantities of the individual light emitting portions. Currents supplied to the individual light emitting portions are controlled by a light quantity adjusting section on the basis of outputs from the light quantity detector. The light quantity adjusting section performs light quantity adjustments of the individual light emitting portions at predetermined time interval.

32 Claims, 32 Drawing Sheets

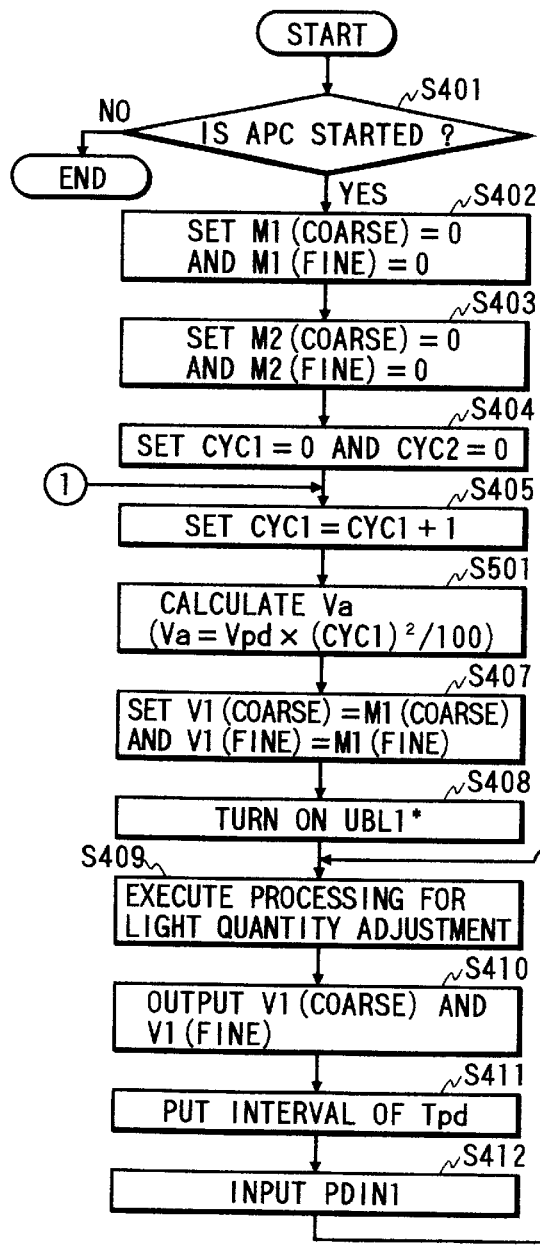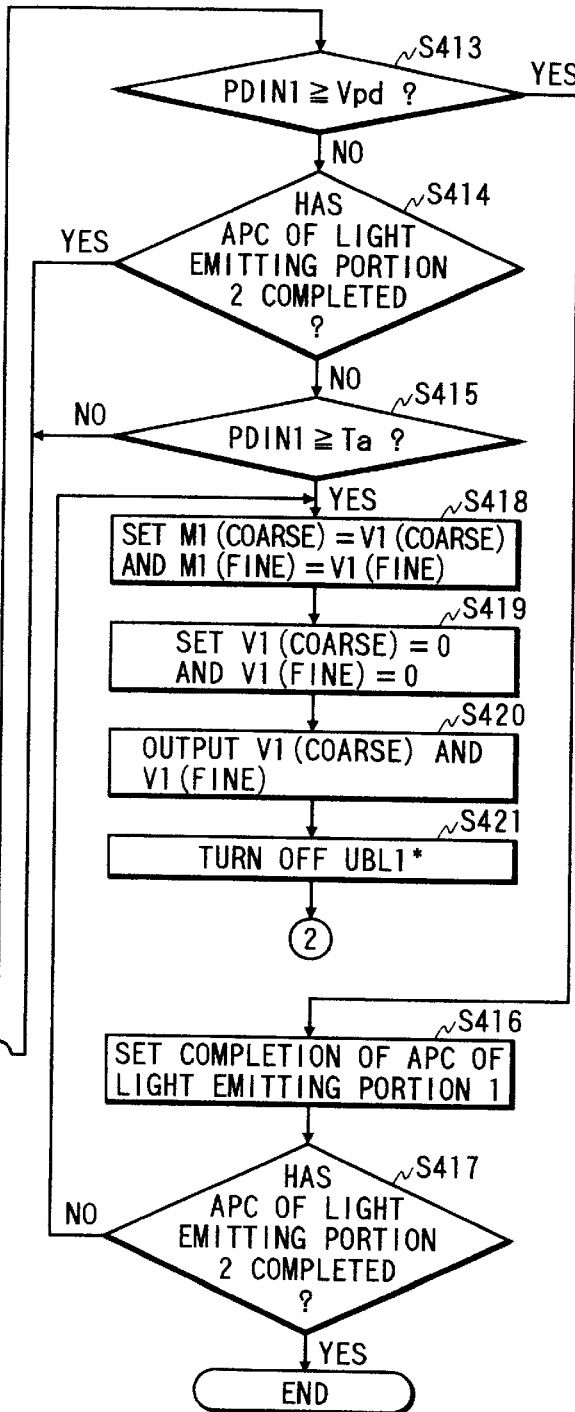
FIG. 14

1

LASER LIGHT QUANTITY CONTROL DEVICE

BACKGROUND OF THE INVENTION

1. Field of the Invention

The present invention relates to a laser light quantity control device for controlling a multi-beam semiconductor laser having a plurality of light emitting portions for emitting laser beams, and an image forming apparatus for performing image formation using the light quantity control device.

2. Related Background Art

Conventionally, a laser element is controlled by a light quantity control device. In light quantity adjustments using a multi-beam semiconductor laser (laser element) having a plurality of light emitting portions for producing a plurality of laser beams in an image forming apparatus such as a laser beam printer, after light quantity adjustments for one light emitting portion are complete, adjustments for the next light emitting portion are performed.

That is, after the light quantity of one light emitting portion has reached a target light quantity and adjustments are complete, the adjustments for the next light emitting portion are started.

However, in such conventional method, light emitting portions which are subjected to adjustments later have larger influences of heat produced by light emitting portions that have been already adjusted. In general, the output light quantity of a semiconductor laser element decreases as its temperature rises even when the laser current remains the same. For this reason, the laser current of a light emitting portion which has undergone light quantity adjustments in a high-temperature state consequently becomes large. In particular, in a laser element of a multi-beam semiconductor laser, the output light quantity of a light emitting portion which has undergone light quantity adjustments last in a high-temperature state under the influence of heat from other light emitting portions is different from that of a light emitting portion which has undergone light quantity adjustments first in a low-temperature state without having any influence of heat from other light emitting portions, when they are made to emit laser beams simultaneously.

SUMMARY OF THE INVENTION

It is, therefore, an object of the present invention to provide a laser light quantity control device that can relax the influence of heat, and an image forming apparatus.

In order to achieve the above object, a laser light quantity control device of the present invention has a semiconductor laser element having a plurality of light emitting portions, light quantity detection means for detecting the light quantities of the individual light emitting portions, and light quantity adjustment means for controlling currents to be supplied to the individual light emitting portions on the basis of outputs from the light quantity detection means, and the device time-divisionally performs light quantity adjustments of the individual light emitting portions at predetermined time intervals.

In the laser light quantity control device of the present invention, the time intervals of the light quantity adjustments performed time-divisionally are gradually prolonged.

In the laser light quantity control device of the present invention, the time intervals of the light quantity adjustments performed time-divisionally are gradually shortened.

In the laser light quantity control device of the present invention, a laser current is supplied to a single light emitting portion to be subjected to light quantity adjustments, and is not supplied to light emitting portions other than the light emitting portion which is being subjected to the light quantity adjustments.

In the laser light quantity control device of the present invention, a plurality of light quantity detection means equivalent to the light quantity detection means are independently present in units of light emitting portions, and the laser currents to be supplied to light emitting portions other than the light emitting portion which is being subjected to the light quantity adjustments maintain the adjustment values of the previous adjustment cycles.

On the other hand, a laser light quantity control device of the present invention has a semiconductor laser element having a plurality of light emitting portions, light quantity detection means for detecting the light quantities of the individual light emitting portions, and light quantity adjustment means for controlling currents to be supplied to the individual light emitting portions on the basis of outputs from the light quantity detection means, and in the device a plurality of intermediate target light quantities before a target light quantity are set, the light emitting portion to be subjected to light quantity adjustments is switched each time the laser light quantity reaches each of the intermediate target light quantities, and the light quantity of each light emitting portion is gradually increased.

In the laser light quantity control device of the present invention, the interval between adjacent intermediate target light quantities is gradually prolonged as the light quantity increases.

In the laser light quantity control device of the present invention, the interval between adjacent intermediate target light quantities is gradually shortened as the light quantity increases.

In the laser light quantity control device of the present invention, a laser current is supplied to a single light emitting portion to be subjected to light quantity adjustments, and is not supplied to light emitting portions other than the light emitting portion which is being subjected to the light quantity adjustments.

In the laser light quantity control device of the present invention, a plurality of light quantity detection means equivalent to the light quantity detection means are independently present in units of light emitting portions, and the laser currents to be supplied to the light emitting portions other than the light emitting portion which is being subjected to the light quantity adjustments maintain the adjustment values of the previous adjustment cycles.

An image forming apparatus of the present invention has the above-mentioned laser light quantity control device, and performs electrophotographic image formation using the laser light quantity control device.

BRIEF DESCRIPTION OF THE DRAWINGS

FIG. 14 is a flow chart showing the light quantity control procedure of the fifth embodiment;

DETAILED DESCRIPTION OF THE PREFERRED EMBODIMENTS

The preferred embodiments of the present invention will be described in detail hereinafter with reference to the accompanying drawings.

Figure 1:
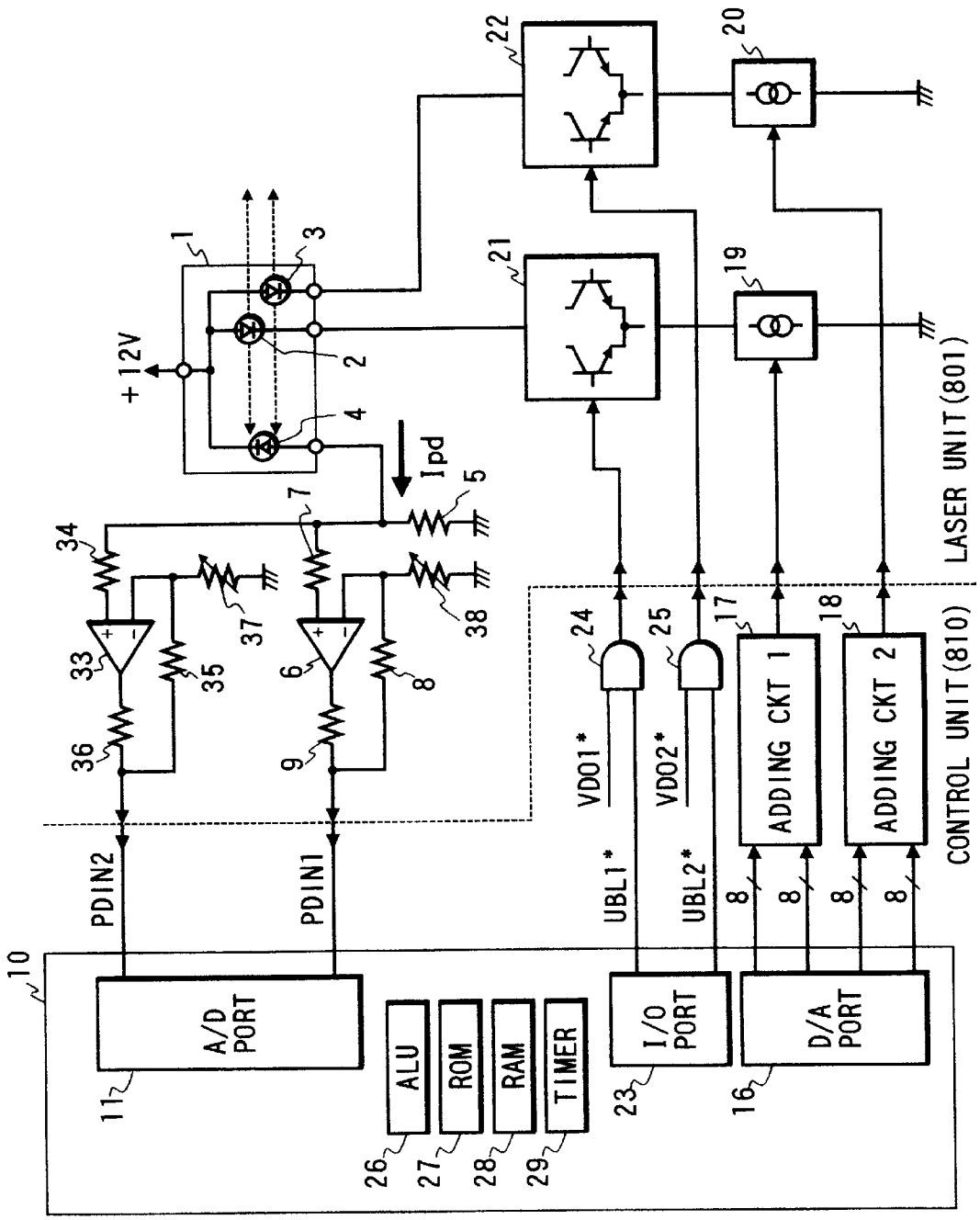
FIG. 1 is a circuit diagram showing the circuit arrangement of the first embodiment.

FIG. 1 shows the arrangement of a light quantity control device (control unit) for a laser beam printer that performs electrophotographic image formation, and a multi-beam semiconductor laser (laser unit 801). The arrangement of the overall image forming apparatus will be described later with reference to FIG. 32. In FIG. 1, a multi-beam semiconductor laser 1 comprises two light emitting portions (light emitting portions 2 and 3), and a PIN photodetector 4 serving as a light quantity detection means for detecting the light quantities of the light emitting portions 2 and 3. The multi-beam semiconductor laser 1 is connected to a laser unit controller 800 (shown in FIG. 32). Output currents (Ipd) output from the PIN photodetector 4 in correspondence with the light quantities of the light emitting portions are current-to-voltage-converted by a resistor 5, and the converted voltages are supplied as light quantity detection signals (PDIN1 and PDIN2) to a CPU 10 serving as a laser light quantity adjustment means via variable gain amplifier circuits respectively constituted by operational amplifiers 6 and 33, output protection resistors 9 and 36, input resistors 7 and 34, feedback resistors 8 and 35, and variable resistors 37 and 38. In this case, the gains of the amplifier circuits are adjusted so that the light quantity detection signals (PDIN1 and PDIN2) equal a setting value (Vpd) when the laser light quantities after the aperture (stop), i.e., the light quantities on the photosensitive drum surface are desired quantities. The laser unit 801 is constituted by the multi-beam semiconductor laser 1 and the laser unit controller 800 (see FIG. 32).

The CPU 10 has an analog-to-digital conversion port (to be referred to as an A/D port hereinafter) 11 for receiving the light quantity detection signals (PDIN1 and PDIN2). A digital-to-analog conversion port (to be referred to as a D/A port hereinafter) 16 supplies two pairs of 8-bit outputs to adding circuits 17 and 18, respectively. Each of the adding circuits 17 and 18 changes weighting coefficients for the two inputs to define coarse or fine adjustments, and supplies the sum to a corresponding one of constant current power supplies 19 and 20 in the semiconductor laser. The constant current power supplies 19 and 20 supply current values corresponding to the input voltages from the adding circuits 17 and 18 to the individual light emitting portions via differential switching circuits 21 and 22.

With these circuits, the CPU 10 controls the laser currents by changing the outputs from the D/A port 16 so that the light quantity detection signals (PDIN1 and PDIN2) equal a target voltage (Vpd) corresponding to the target light quantity. An input/output port (to be referred to as an I/O port hereinafter) 23 outputs forced light emitting signals (UBL1 and UBL2), which are input to AND circuits 24 and 25 together with video signals (VDO1 and VDO2). When one of the forced light emitting signal (UBL1 or UBL2) and the video signal (VDO1 or VDO2) changes to LOW level, a LOW output is supplied from the AND circuit to a corresponding one of the differential switching circuits 21 and 22. Currents output from the constant current power supplies 19 and 20 are supplied to the semiconductor laser side to cause the semiconductor laser to emit light. The CPU 10 also includes an arithmetic logic unit (to be referred to as an ALU hereinafter) 26, a ROM 27 serving as a storage means, a RAM 28, a timer 29, and the like.

Figure 2:
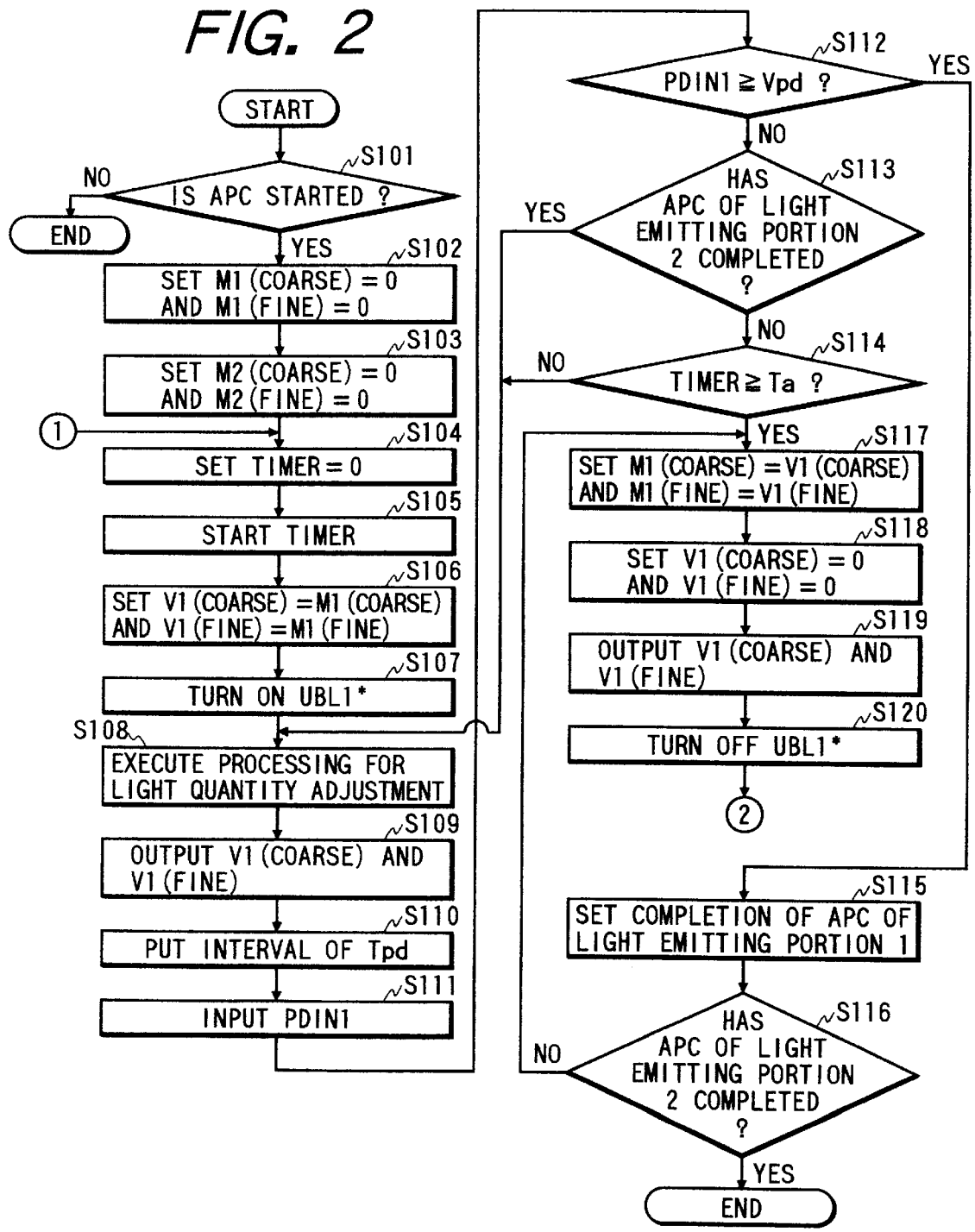
FIG. 2 is a flow chart showing the light quantity control procedure of the first embodiment.
Figure 3:
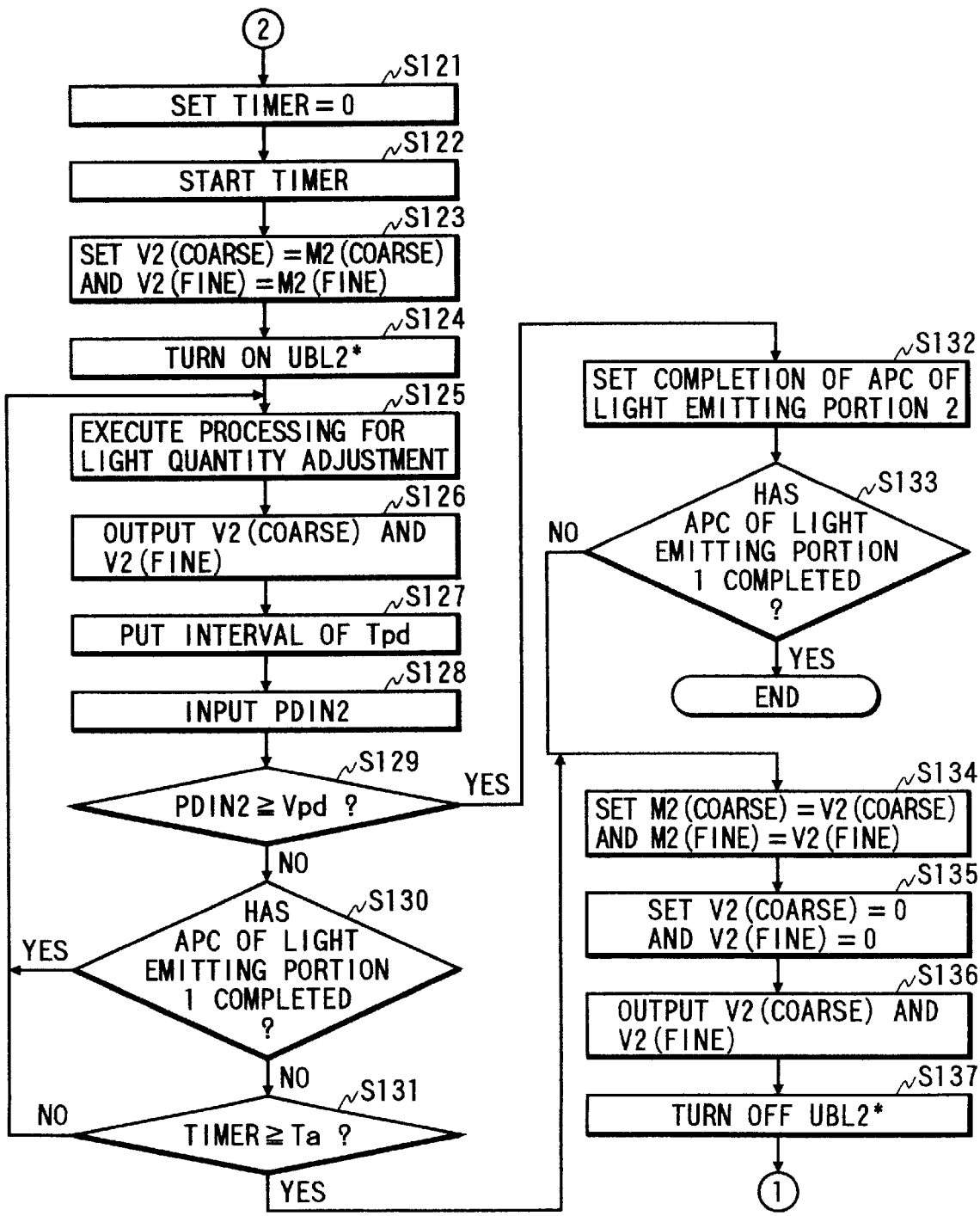
FIG. 3 is a flow chart showing the light quantity control procedure of the first embodiment.

The light quantity control executed in the above-mentioned arrangement will be described below with reference to the flow chart in FIG. 2. When the light quantity control (Auto Power Control: to be abbreviated as APC hereinafter) of the laser shown in FIGS. 2 and 3 is started by the CPU 10, the CPU 10 resets to 0 (zero) the storage values of coarse adjustment outputs (M1(coarse) and M2(coarse)) and fine adjustment outputs (M1(fine) and M2(fine)) to be supplied to the individual light emitting portions in step S101, and starts the APC of light emitting portion 1 in steps S102 and S103.

In the APC of light emitting portion 1, the CPU 10 resets a timer (TIMER) for counting the APC time to zero (S104), and starts counting (S105). Subsequently, the CPU 10 sets the storage values in coarse and fine adjustment output values (V1(coarse) and V1(fine) of the D/A output port (S106), and turns on a forced light emitting signal (UBL1*) (LOW in this case since UBL1* is LOW TRUE) to supply a laser current to light emitting portion 1 (S107).

Thereafter, the CPU 10 performs arithmetic processing for raising the laser light quantity to a target value so as to determine the coarse adjustment value (V1(coarse)) and the fine adjustment value (V1(fine)) (S108), and outputs the determined values (S109). In consideration of the time constant of the PIN photodetector 4 and the like, the CPU 10 puts a predetermined time interval (Tpd) (S110), and then detects the value of the light quantity detection signal (PDIN1) (S111). The CPU 10 checks if the detected value (PDIN1) has reached the target voltage (Vpd) (S112). If the detected value (PDIN1) has not reached the target voltage (Vpd) yet, and if the APC of light emitting portion 2 has been completed (YES in step S113) or if the timer (TIMER) has not reached a predetermined time (Ta) (NO in step S114), the flow returns to step S108 to repeat the arithmetic processing for further raising the laser light quantity. On the other hand, if the APC of light emitting portion 2 has not been completed yet (NO in step S113) and if the timer (TIMER) has reached the predetermined time (Ta) (YES in step S114), or if the light quantity detected value (PDIN1) has reached the target voltage (Vpd) (YES in step S112) and completion of the APC of light emitting portion 1 is set (S115), and thereafter, if the APC of light emitting portion 2 has not been completed yet (NO in step S116), the CPU 10 sets the coarse and fine adjustment output values (V1 (coarse) and V1(fine)) of the D/A output port as storage values (S117). Subsequently, the CPU 10 resets the coarse and fine adjustment output values (V1(coarse) and V1(fine)) of the D/A output port to 0 (zero), and outputs them (S119). In order to cut the laser current to light emitting portion 1, the CPU 10 turns off the forced light emitting signal (VBL1*) (S120). In this manner, one cycle of the APC of light emitting portion 1 is completed, and the CPU 10 then starts the APC of light emitting portion 2. The APC (steps S121 to S137) of light emitting portion 2 is the same as that (steps S104 to S120) of light emitting portion 1.

Figure 4:
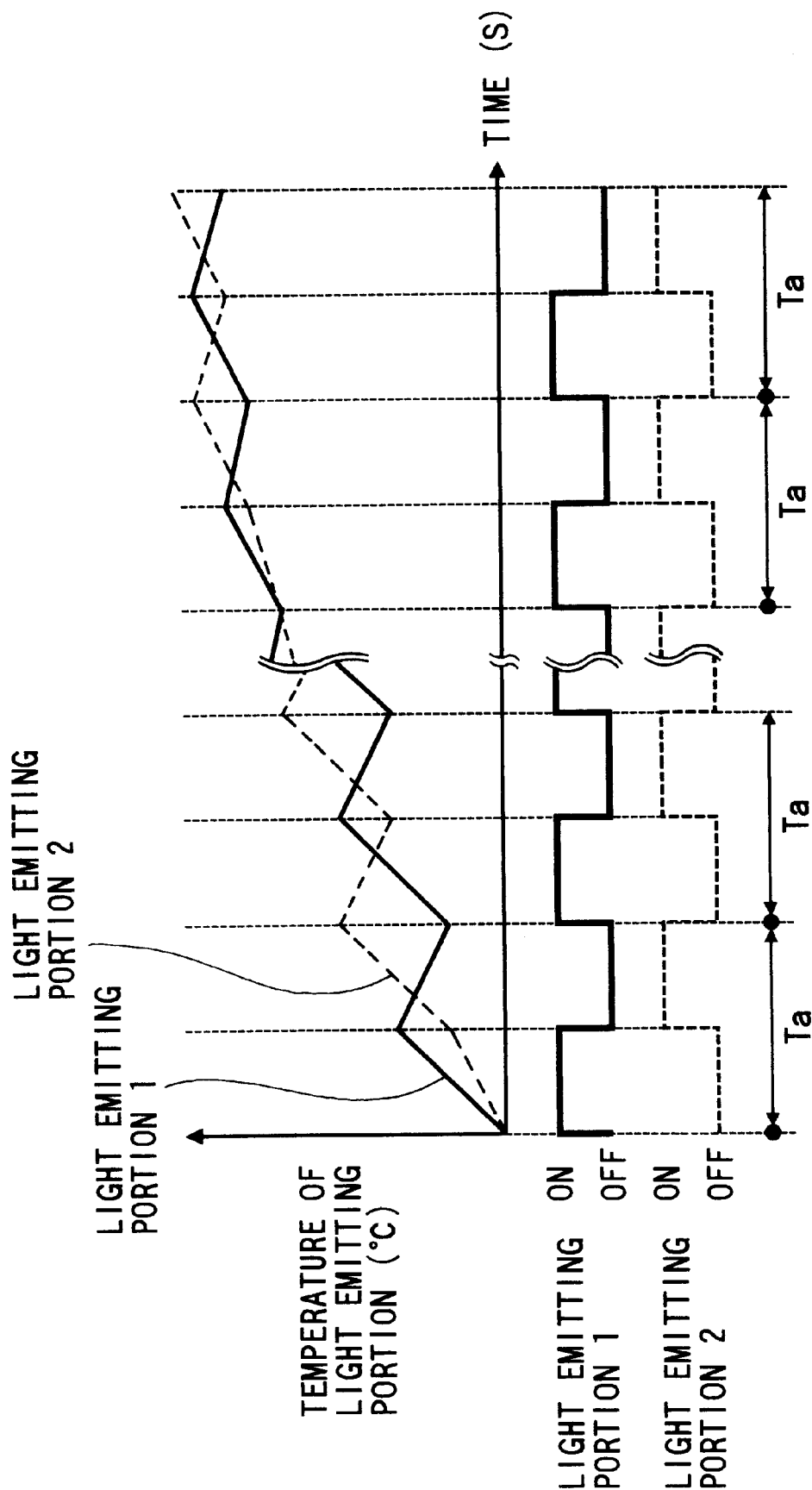
FIG. 4 is a graph showing changes in temperature of light emitting portions of the first embodiment.

FIG. 4 shows, as a reference, changes in temperature of the individual light emitting portions as time elapses upon execution of the above-mentioned control. With this control, the CPU 10 alternately performs the APC of light emitting portions 1 and 2 at predetermined time intervals.

As described above, according to this embodiment, when the APC of the individual light emitting portions (light emitting portions 1 and 2) is time-divisionally performed at predetermined time intervals, as shown in FIG. 4, the influence of heat from the other light emitting portion during the APC can be nearly equalized in the two light emitting portions, and the output light quantity difference between the light emitting portions can be reduced.

The second embodiment of the present invention will be described below with reference to the accompanying drawings. Note that the system hardware arrangement of the second embodiment is the same as that in the first embodiment, and a detailed description thereof will be omitted.

Figure 5:
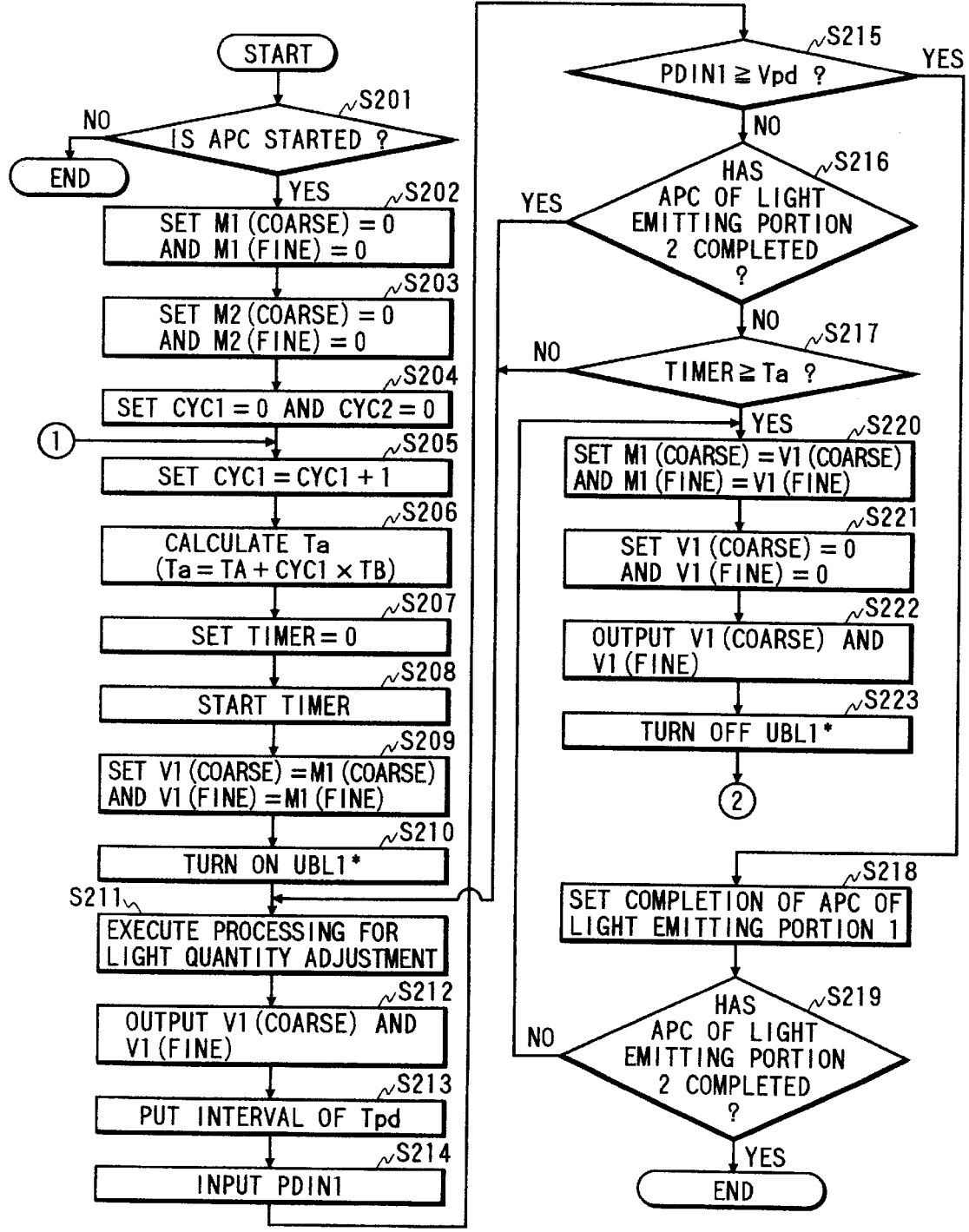
FIG. 5 is a flow chart showing the light quantity control procedure of the second embodiment.
Figure 6:
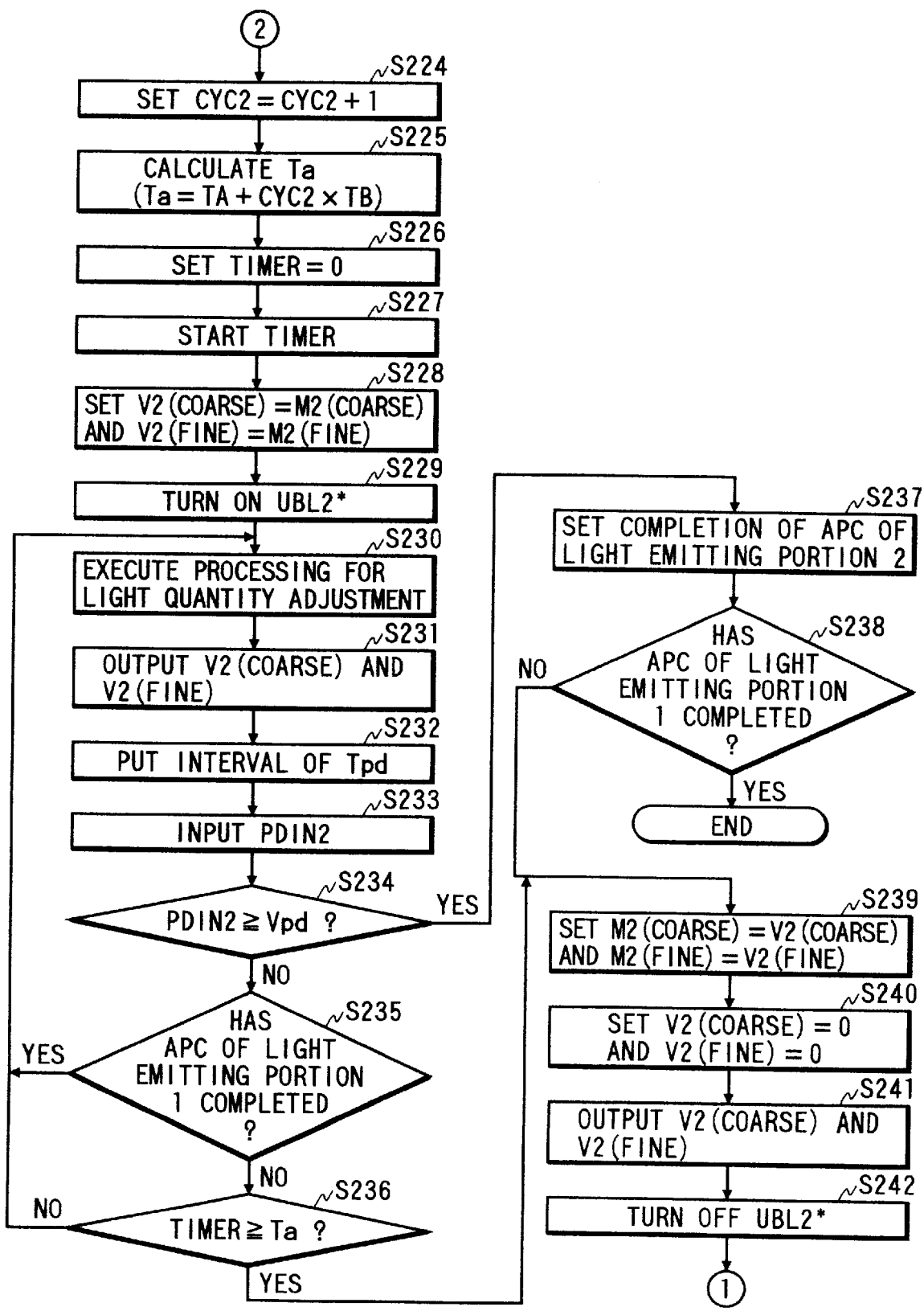
FIG. 6 is a flow chart showing the light quantity control procedure of the second embodiment.

FIGS. 5 and 6 are flow charts showing the control contents of this embodiment. The difference from the first embodiment is as follows. That is, in order to gradually prolong the laser APC time (light quantity adjustment time) for one cycle, the CPU 10 resets the numbers (CYC1 and CYC2) of APC cycles of the individual light emitting portions to 0 (zero) in step S204, and counts up the number of cycles in response to the start of the APC of each light emitting portion (S205, S224). The CPU 10 calculates the laser APC time (Ta) for one cycle by (TA+CYC1×TB, TA+CYC2×TB) (S206, S225).

Figure 7:
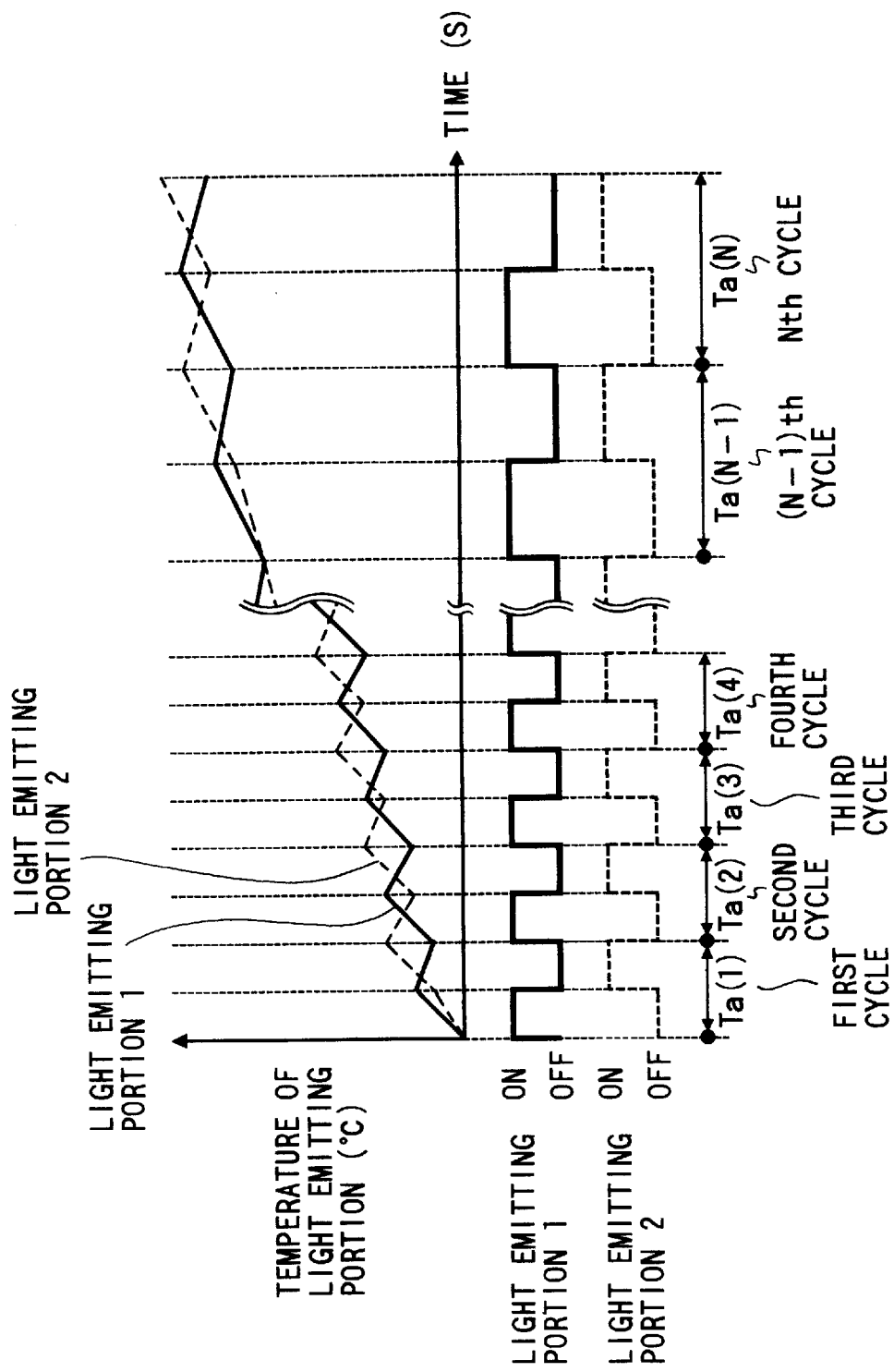
FIG. 7 is a graph showing changes in temperature of light emitting portions of the second embodiment.

Note that TA is a fixed constant value, and TB is the APC time that increases in units of cycles. The constants TA and TB are set at optimal values in correspondence with the heat resistance between the light emitting portions, the heat capacity of the laser element itself, and the like, and the control system including the laser element, control circuit, and control system in addition to the arithmetic operation method of the laser light quantity adjustments. In this embodiment, the APC time is calculated by a linear formula, but may be calculated by other formulas depending on the control system of interest. FIG. 7 shows, as a reference, changes in temperature during the laser APC of this embodiment.

As described above, according to the present invention, since the time intervals of the APC which is executed time-divisionally are gradually prolonged, the light emitting intervals can be shortened in the first half of the APC in which increases in laser current and in quantity of heat produced are large. With this control, even when a laser array with a large heat time constant due to a large heat resistance between the light emitting portions and a large heat capacity of the laser element itself is used, the influence of heat from the other light emitting portion during the APC can be nearly equalized in the two light emitting portions, and the output light quantity difference between the light emitting portions can be reduced.

Figure 8:
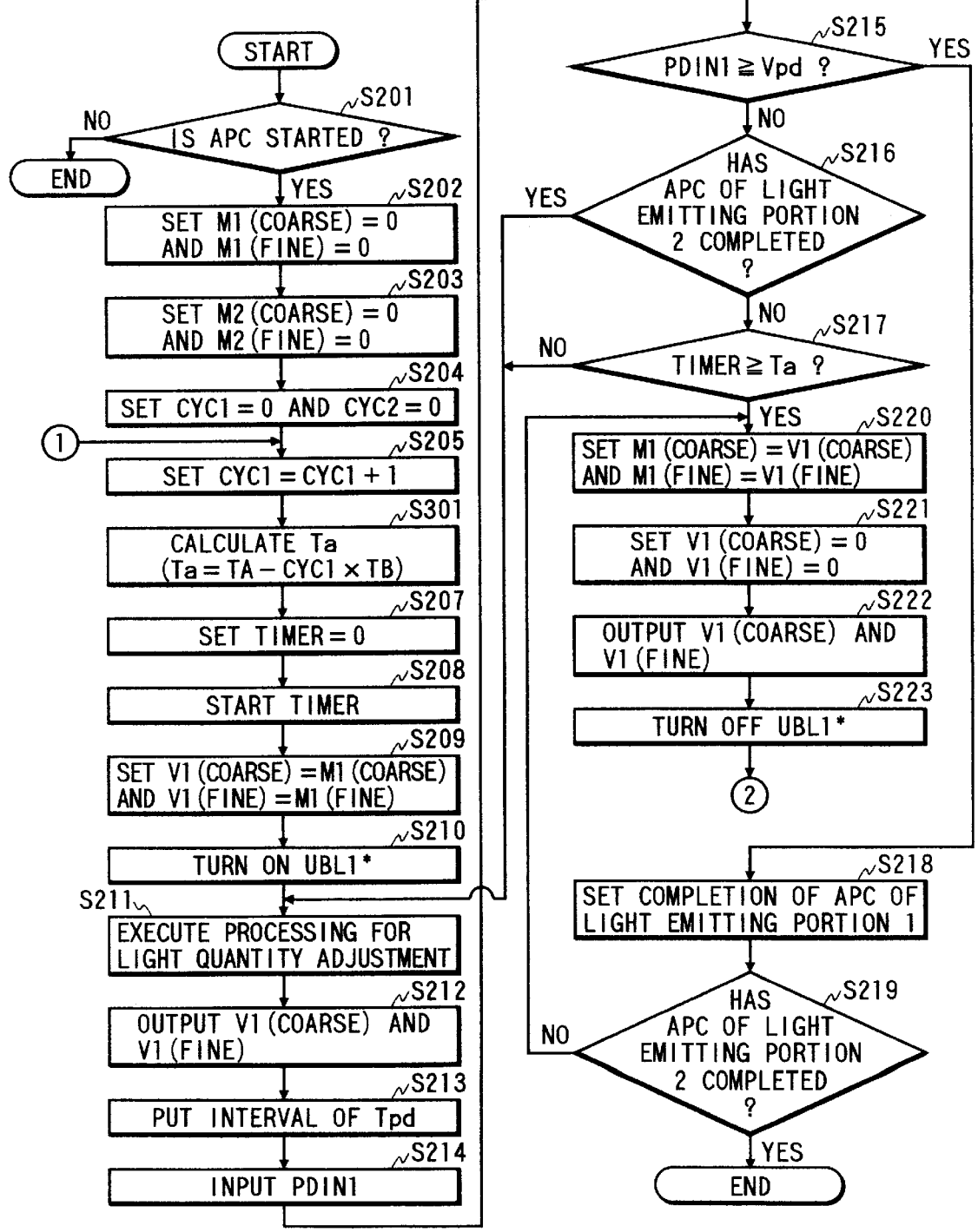
FIG. 8 is a flow chart showing the light quantity control procedure of the third embodiment.
Figure 9:
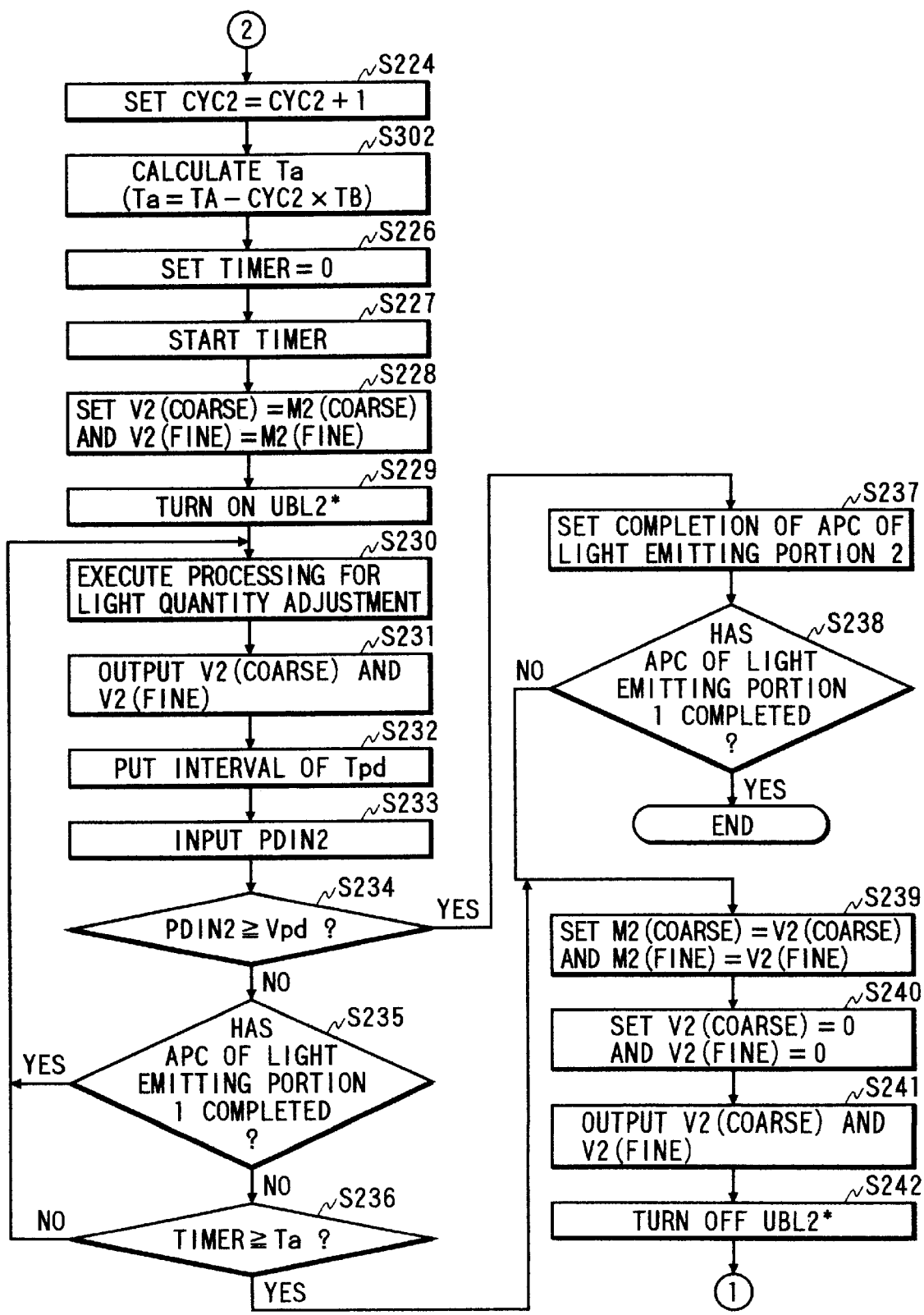
FIG. 9 is a flow chart showing the light quantity control procedure of the third embodiment.

The third embodiment of the present invention will be described below with reference to the accompanying drawings. Note that the system hardware arrangement of the third embodiment is the same as that in the first embodiment, and a detailed description thereof will be omitted. FIGS. 8 and 9 are flow charts showing the control contents of this embodiment. The difference from the second embodiment is that the CPU 10 calculates the laser APC time (Ta) for one cycle by (TA−CYC1×TB, TA−CYC2×TB) (S301, S302) in order to gradually shorten the laser APC time for one cycle.

Note that TA is a fixed constant value, and TB is the APC time that decreases in units of cycles. The constants TA and TB are set at optimal values in correspondence with the heat resistance between the light emitting portions, the heat capacity of the laser element itself, and the like, and the control system including the laser element, control circuit, and control system in addition to the arithmetic operation method of the laser light quantity adjustments.

Figure 10:
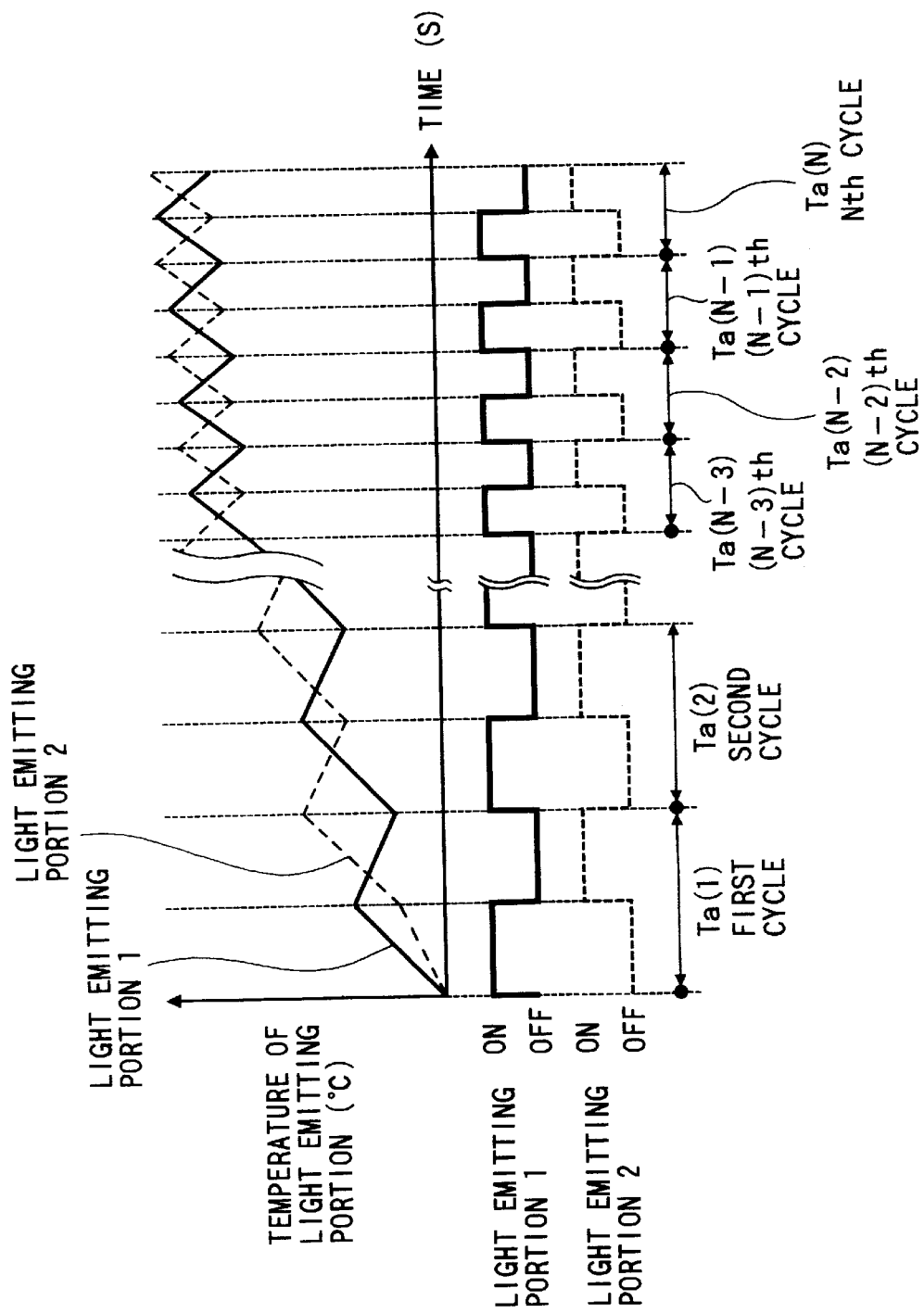
FIG. 10 is a graph showing changes in temperature of light emitting portions of the third embodiment.

In this embodiment, the APC time is calculated by a linear formula, but may be calculated by other formulas depending on the control system in question. FIG. 10 shows, as a reference, changes in temperature during the laser APC of this embodiment.

As described above, according to the present invention, since the time intervals of the APC which is executed time-divisionally are gradually shortened, the light emitting intervals can be shortened in the second half of the APC in which both the laser current and quantity of heat produced are large. With this control, even when a laser element with a small heat capacity or a laser array with a small heat resistance between the laser element and the external environment is used, the influence of heat from the other light emitting portion during the APC can be nearly equalized in the two light emitting portions, and the output light quantity difference between the light emitting portions can be reduced.

Figure 11:
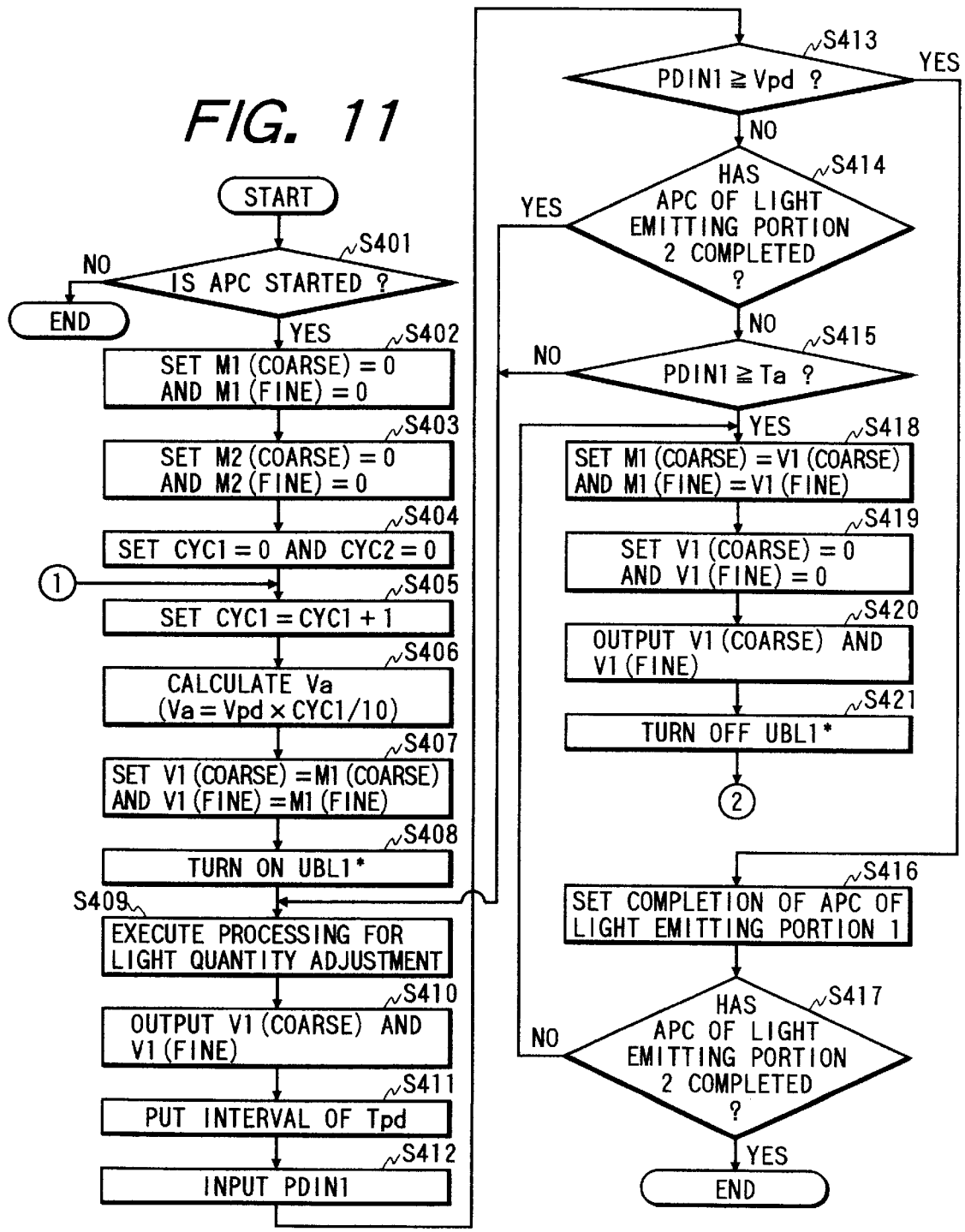
FIG. 11 is a flow chart showing the light quantity control procedure of the fourth embodiment.
Figure 12:
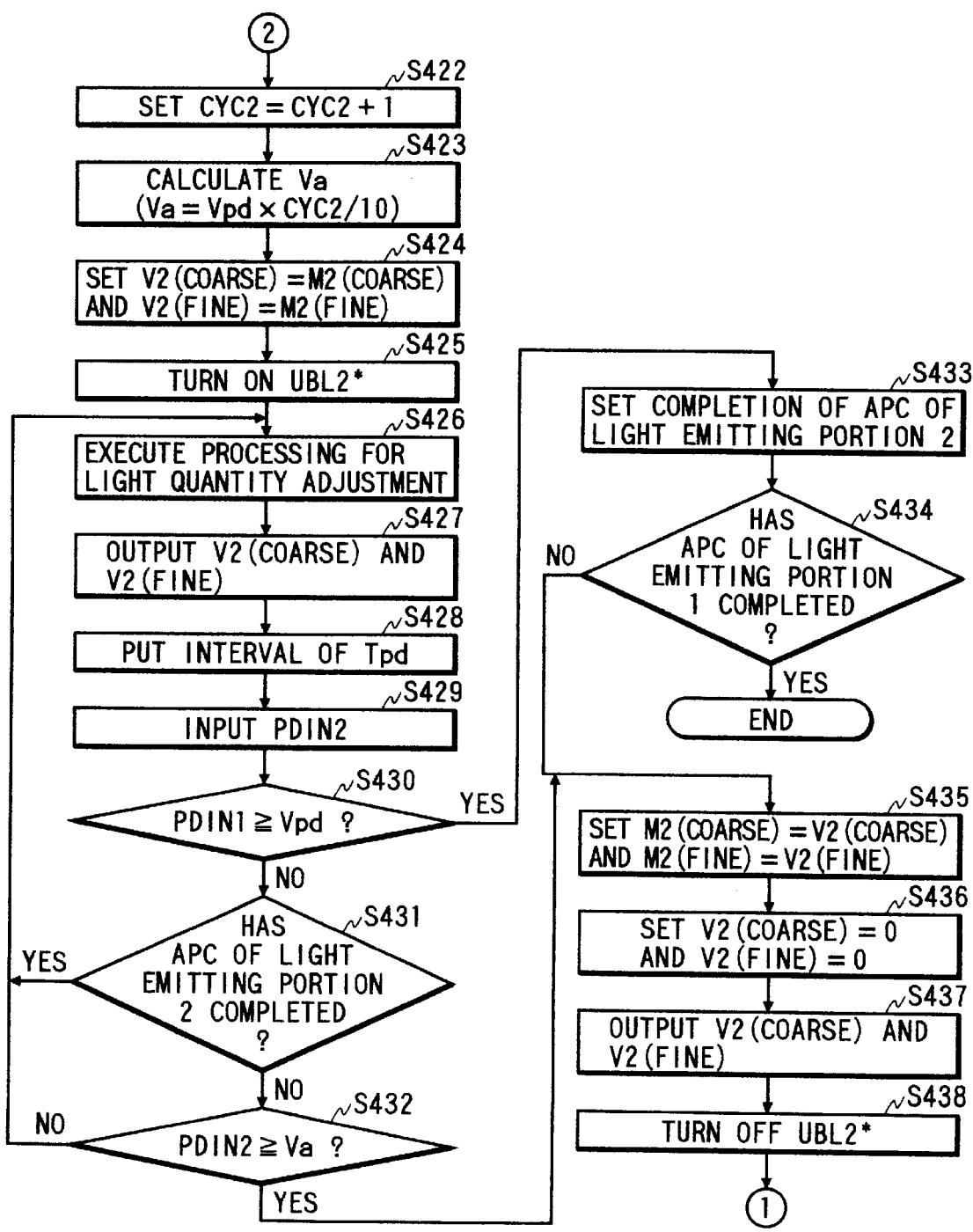
FIG. 12 is a flow chart showing the light quantity control procedure of the fourth embodiment.

The fourth embodiment of the present invention will be described below with reference to the accompanying drawings. Note that the arrangement of the fourth embodiment is the same as that in the first embodiment, and a detailed description thereof will be omitted. FIGS. 11 and 12 are flow charts showing the control contents of this embodiment. When the laser APC is started (S401), the CPU 10 resets, to 0 (zero), the storage values of the coarse adjustment output values (M1(coarse) and M2(coarse)) and fine adjustment output values (M1(fine) and M2(fine)) to the individual light emitting portions, and the numbers (CYC1 and CYC2) of APC cycles of the individual light emitting portions (S402, S403, S404), and thereafter, the CPU 10 starts the APC of light emitting portion 1. In the APC of light emitting portion 1, the CPU 10 counts up the number of APC cycles (S405), and calculates the intermediate target light quantity value (Va) by (Vpd×CYC1÷10) (S406).

Note that Vpd is the target voltage corresponding to the final target light quantity value of the light quantity detection signal, which is raised by a value $1/10$ of the final target light quantity value in each cycle of the APC. A maximum of 10 cycles of APC are performed for each light emitting portion. However, the number of cycles may be set at a value other than 10 cycles depending on the control system of interest.

Subsequently, the CPU 10 sets the storage values in the coarse and fine adjustment output values (V1(coarse) and V1(fine)) of the D/A output port (S407), and turns on the forced light emitting signal (UBL1*) for supplying a laser current to light emitting portion 1 (S408). Thereafter, the CPU 10 performs arithmetic processing for raising the laser light quantity to the target value to determine the coarse adjustment value (V1(coarse)) and the fine adjustment value (V1(fine)) (S409), and outputs the determined values (S410).

In consideration of the time constant of the PIN photodetector 4 and the like, the CPU 10 puts a predetermined time interval (Tpd) (S411), and then detects the value of the light quantity detection signal (PDIN1) (S412). The CPU 10 checks if the detected value (PDIN1) has reached the target voltage (Vpd) (S413). If the detected value (PDIN1) has not reached the target voltage (Vpd) yet, and if the APC of light emitting portion 2 has been completed (S414) or if the light quantity detection signal (PDIN1) has not reached the intermediate target light quantity (Va) (S415), the CPU 10 repeats the arithmetic processing (S409) for further raising the laser light quantity.

On the other hand, if the APC of light emitting portion 2 has not been completed yet (S414) and if the light quantity detected value (PDIN1) has reached the intermediate target light quantity value (Va) (S415), or if the light quantity detected value (PDIN1) has reached the target voltage (Vpd) (S413) and completion of the APC of light emitting portion 1 is set (S416), and thereafter, if the APC of light emitting portion 2 has not been completed yet (S417), the CPU 10 sets the coarse and fine adjustment output values (V1 (coarse) and V1(fine)) of the D/A output port as storage values (S418), and resets the coarse and fine adjustment output values (V1(coarse) and V1(fine)) of the D/A output port to 0 (zero) (S419) and outputs them (S420).

Figure 13:
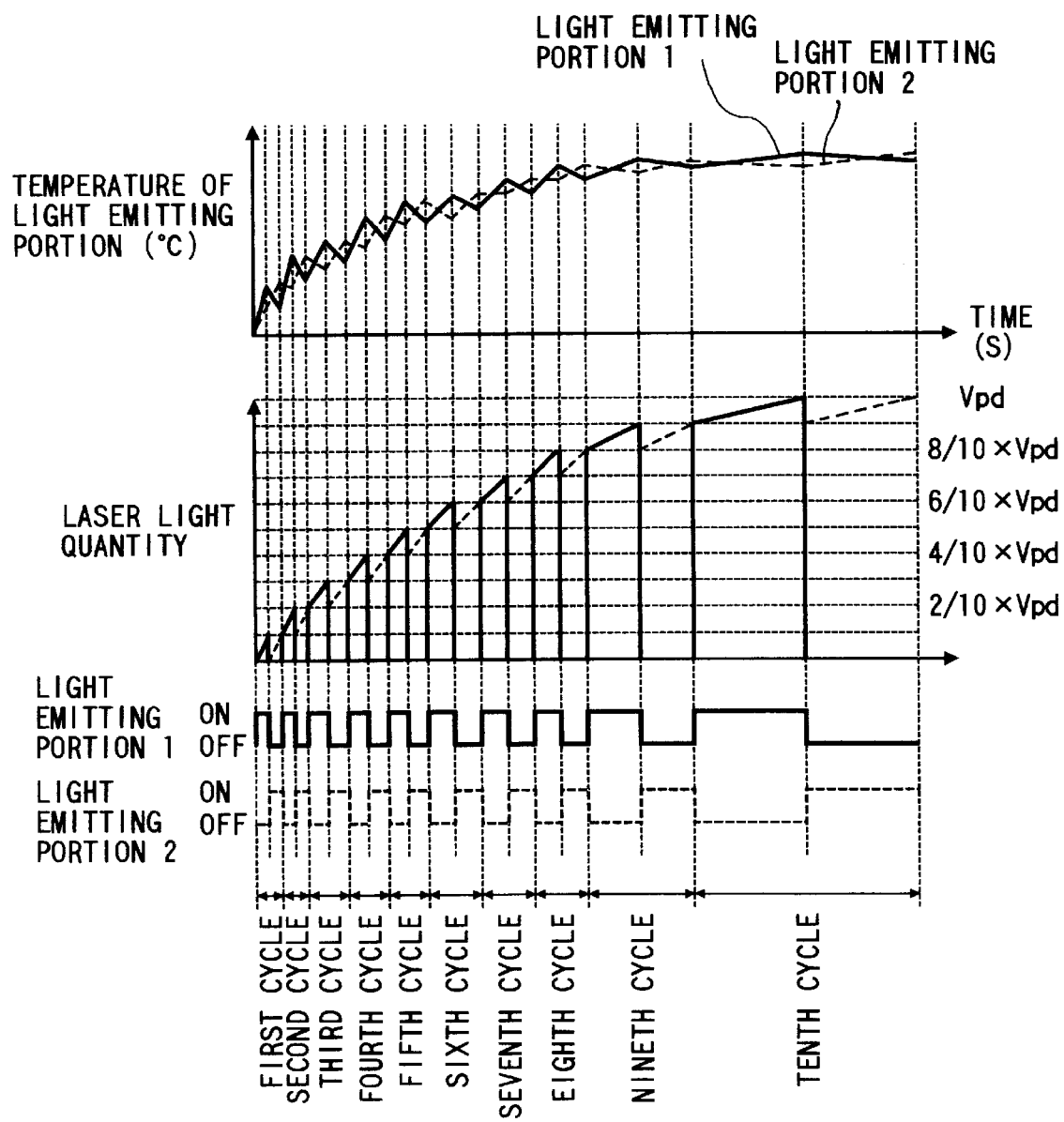
FIG. 13 is a graph showing changes in temperature of light emitting portions of the fourth embodiment.

In order to cut the laser current to light emitting portion 1, the CPU 10 turns off the forced light emitting signal (VBL1*) (S421). In this manner, one cycle of the APC of light emitting portion 1 is completed, and the CPU 10 then starts the APC of light emitting portion 2. The APC (steps S422 to S438) of light emitting portion 2 is the same as that (steps S405 to S421) of light emitting portion 1. FIG. 13 shows changes in temperature during the laser APC of this embodiment.

As described above, according to the present invention, since a plurality of intermediate target light quantities are set at equal intervals before the target light quantity, and the light emitting portion to be subjected to adjustments is switched each time the laser light quantity reaches each intermediate target light quantity, the power consumption quantities of the individual light emitting portions in the single adjustment cycle can equal each other, the influence of heat from the other light emitting portion during the APC can be nearly equalized in the two light emitting portions, and the output light quantity difference between the light emitting portions can be reduced.

The fifth embodiment of the present invention will be described below with reference to the accompanying drawings. Note that the system arrangement of this embodiment is the same as that in the first embodiment, and a detailed description thereof will be omitted.

Figure 15:
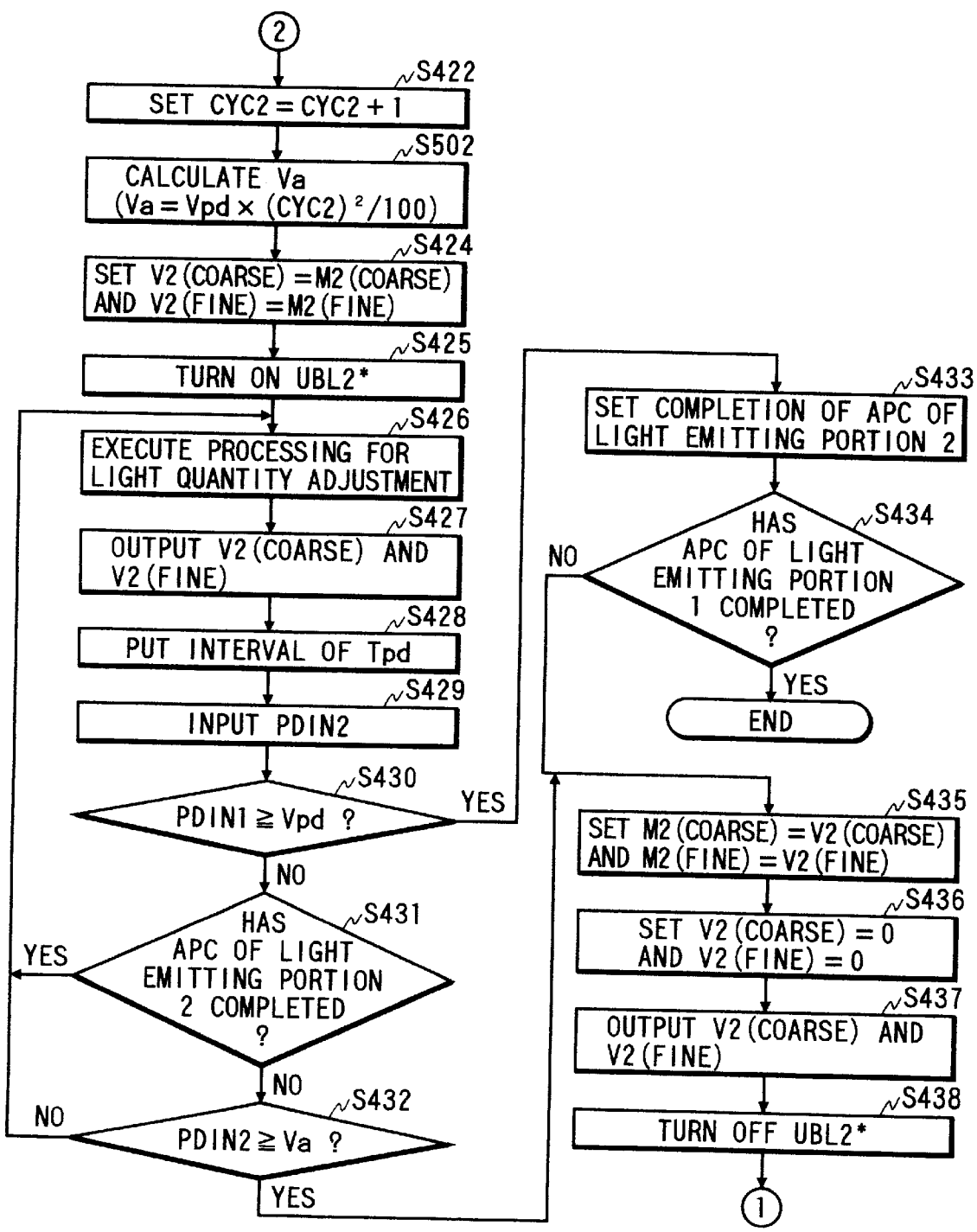
FIG. 15 is a flow chart showing the light quantity control procedure of the fifth embodiment.

FIGS. 14 and 15 are flow charts showing the control contents of this embodiment. The difference from the fourth embodiment is that the CPU 10 calculates the intermediate target light quantity value (Va) by (Vpd×(CYC1)$^2$÷100, Vpd×(CYC2)$^2$÷100) (S501, S502) so as to gradually prolong the intervals (increments of laser light quantity in units of cycles) of the intermediate target light quantity value (Va) as the light quantity increases.

Figure 16:
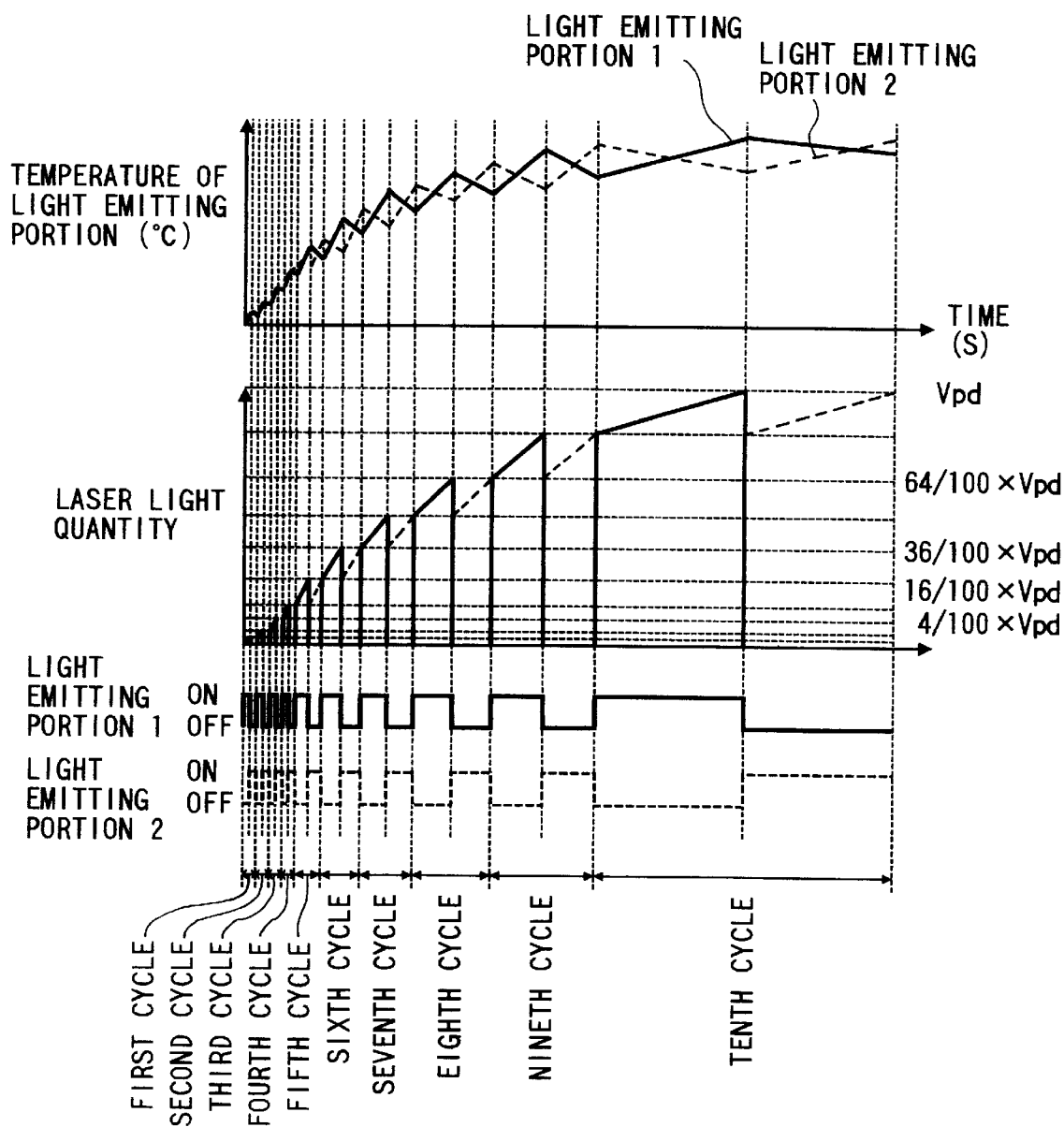
FIG. 16 is a graph showing changes in temperature of light emitting portions of the fifth embodiment.

In this embodiment, the total number of cycles is set at 10 cycles. However, the number of cycles may be set at a value other than 10 cycles depending on the control system of interest. In this embodiment, the APC time is calculated by a quadratic formula, but may be calculated by other formulas depending on the control system in question. FIG. 16 shows changes in temperature during the laser APC of this embodiment.

As described above, according to the present invention, since the intervals of the intermediate target light quantity value are gradually prolonged as the light quantity increases, even when a laser array with a large heat time constant due to a large heat resistance between the light emitting portions or a large heat capacity of the laser element itself is used, the influence of heat from the other light emitting portion during the APC can be nearly equalized in the two light emitting portions, and the output light quantity difference between the light emitting portions can be reduced.

Figure 17:
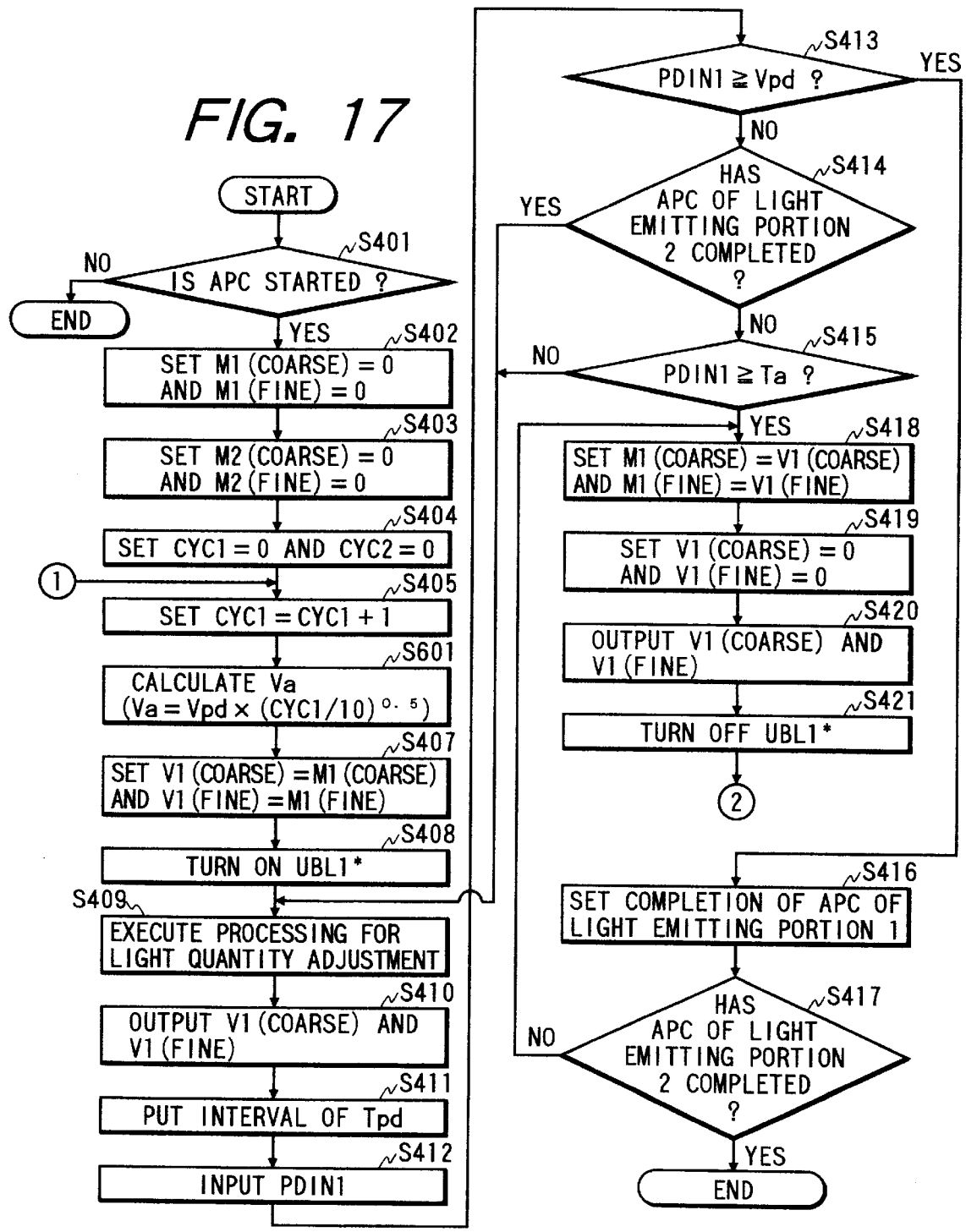
FIG. 17 is a flow chart showing the light quantity control procedure of the sixth embodiment.
Figure 18:
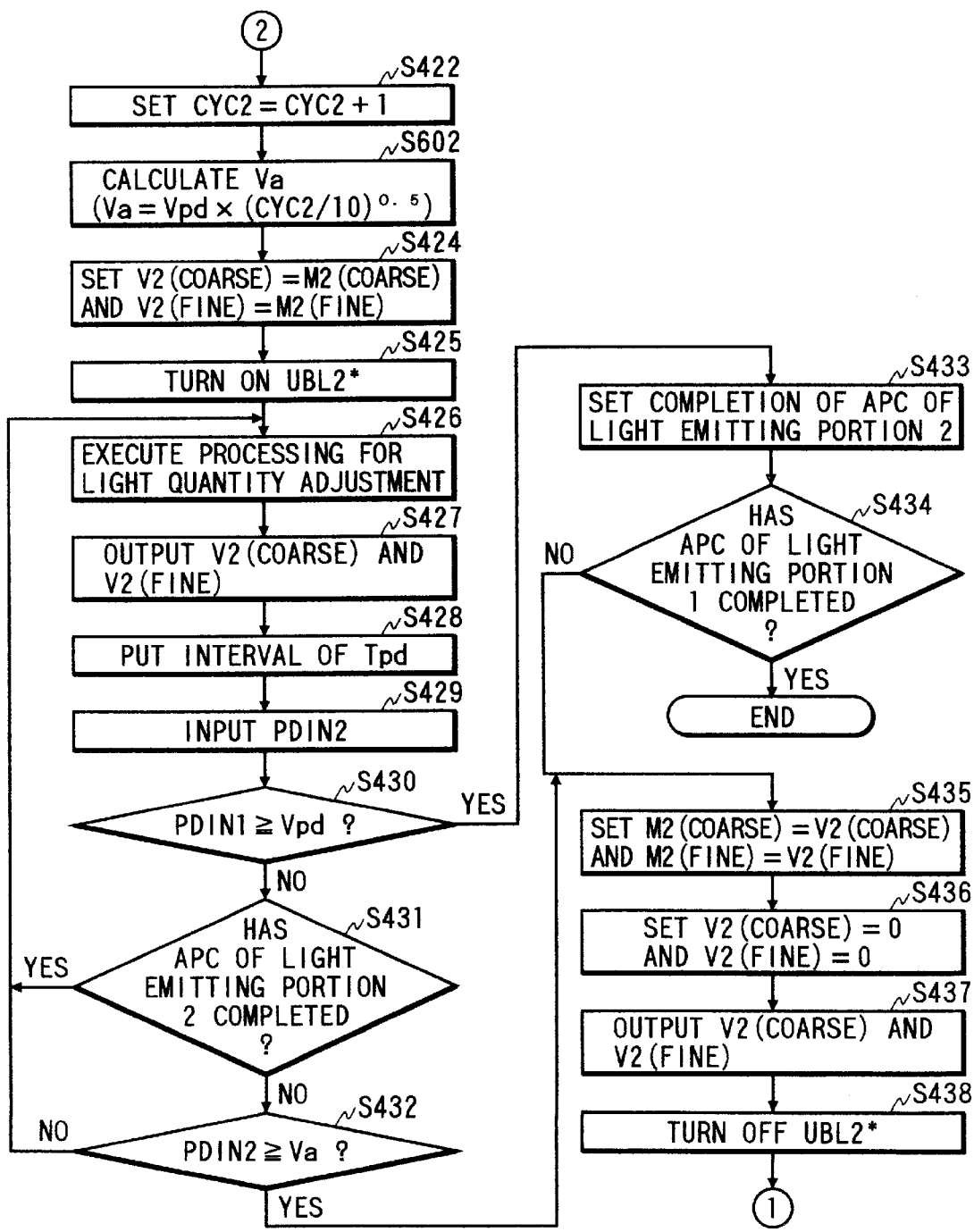
FIG. 18 is a flow chart showing the light quantity control procedure of the sixth embodiment.

The sixth embodiment of the present invention will be described below with reference to the accompanying drawings. Note that the system arrangement of this embodiment is the same as that in the first embodiment, and a detailed description thereof will be omitted. FIGS. 17 and 18 are flow charts showing the control contents of this embodiment. The difference from the fourth embodiment is that the CPU 10 calculates the intermediate target light quantity value (Va) by (Vpd×(CYC1÷10)$^{0.5}$, Vpd×(CYC2÷10)$^{0.5}$) (S601, S602) so as to gradually shorten the intervals (increments of laser light quantity in units of cycles) of the intermediate target light quantity value (Va) as the light quantity increases.

Figure 19:
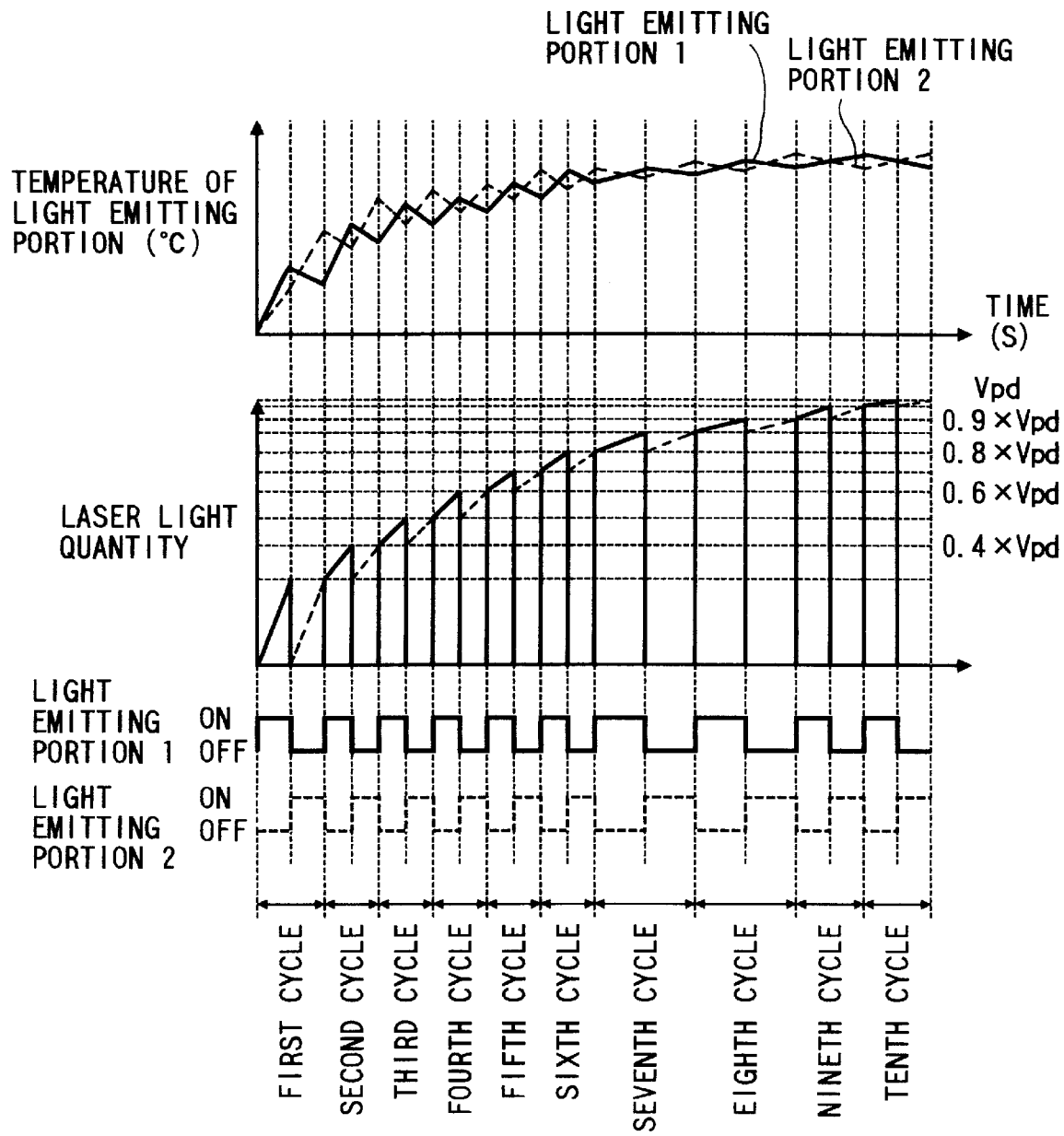
FIG. 19 is a graph showing changes in temperature of light emitting portions of the sixth embodiment.

In this embodiment, the total number of cycles is set at 10 cycles. However, the number of cycles may be set at a value other than 10 cycles depending on the control system of interest. In this embodiment, the APC time is calculated by a square root, but may be calculated by other formulas depending on the control system in question. FIG. 19 shows changes in temperature during the laser APC of this embodiment.

As described above, according to the present invention, since the intervals of the intermediate target light quantity value are gradually shortened as the light quantity increases, even when a laser element with a small heat capacity or a laser array with a small heat resistance between the laser element and the external environment is used, the influence of heat from the other light emitting portion during the APC can be nearly equalized in the two light emitting portions, and the output light quantity difference between the light emitting portions can be reduced.

Figure 20:
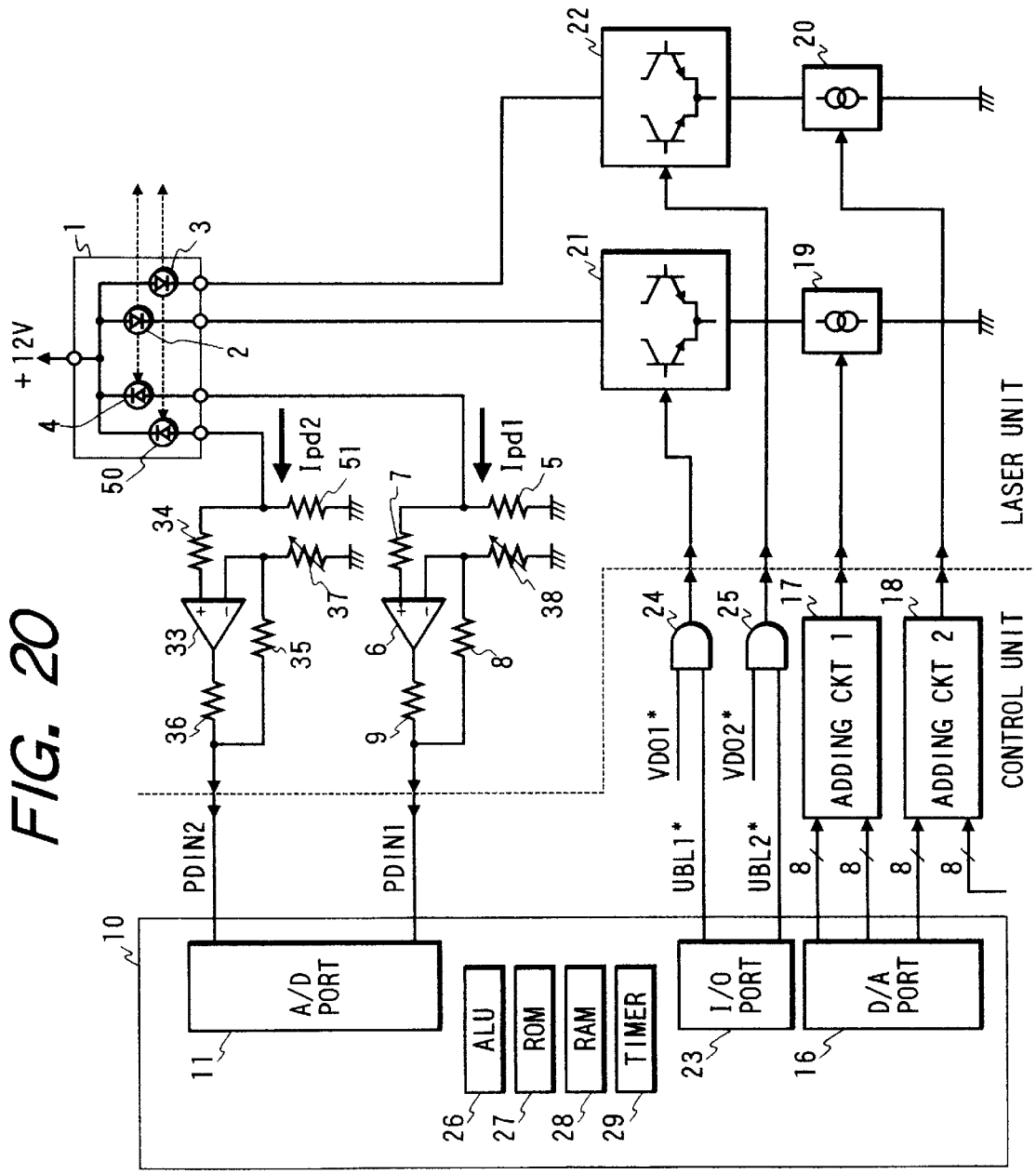
FIG. 20 is a circuit diagram showing the circuit arrangement of the seventh embodiment.

The seventh embodiment of the present invention will be described below with reference to the accompanying drawings. FIG. 20 shows the arrangement of this embodiment. The difference from the fourth embodiment is that a PIN photodetector 50 is added to the multi-beam semiconductor laser 1, so that the light quantity of the light emitting portion 2 is detected by the PIN photodetector 4 and the light quantity of the light emitting portion 3 is detected by the PIN photodetector 50, independently. A resistor 51 current-to-voltage converts the output current (Ipd2) from the PIN photodetector 50.

Figure 21:
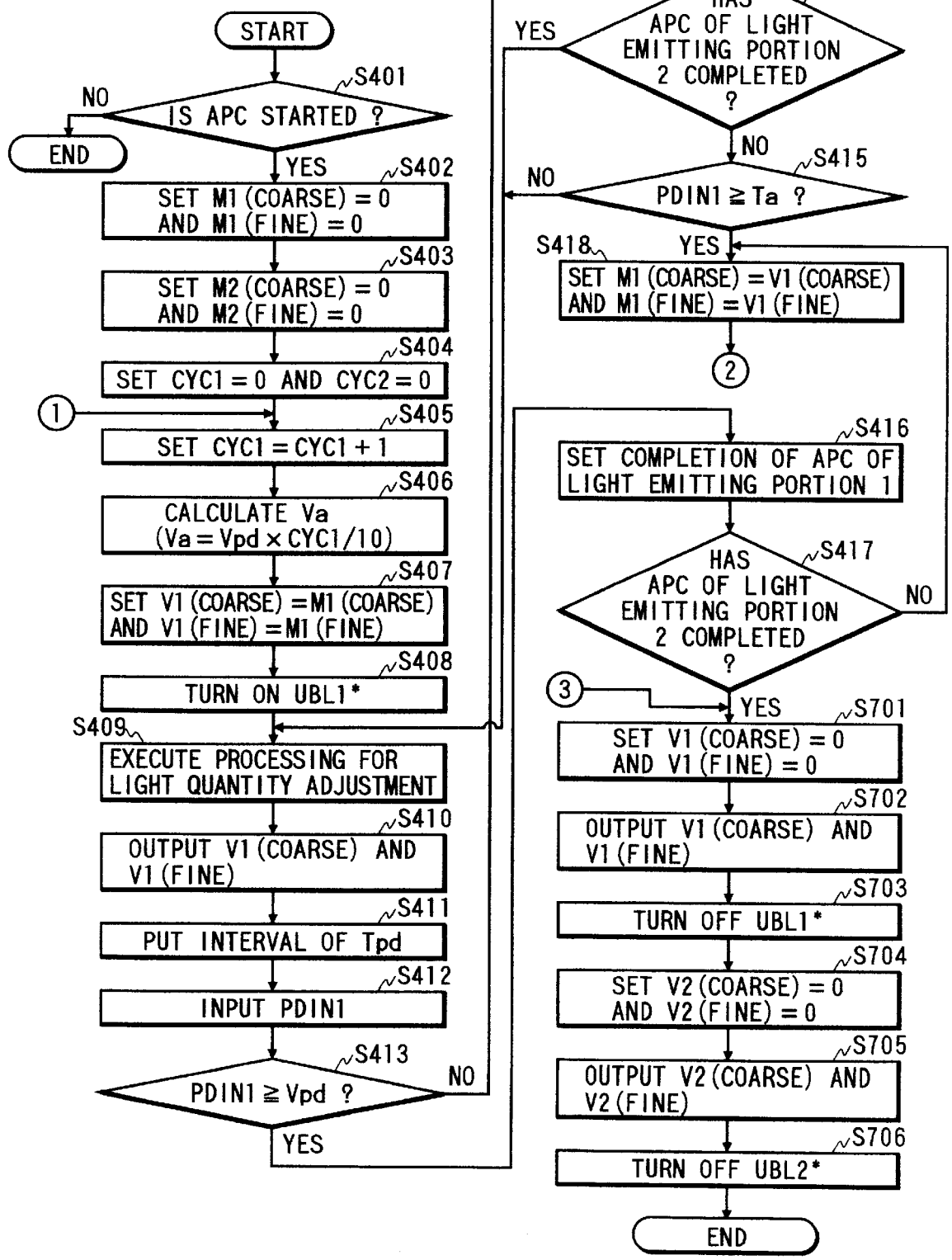
FIG. 21 is a flow chart showing the light quantity control procedure of the seventh embodiment.
Figure 22:
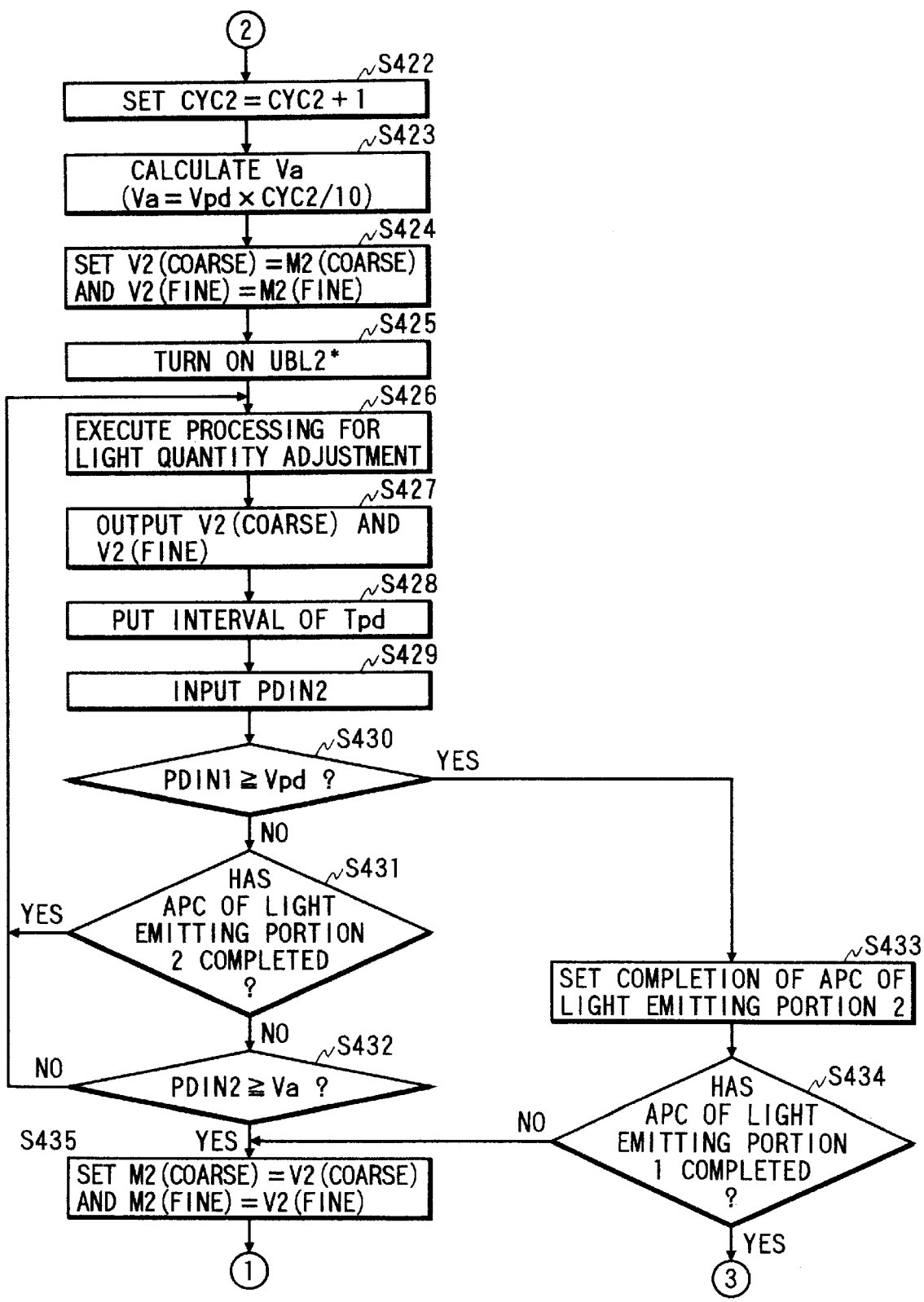
FIG. 22 is a flow chart showing the light quantity control procedure of the seventh embodiment.
Figure 23:
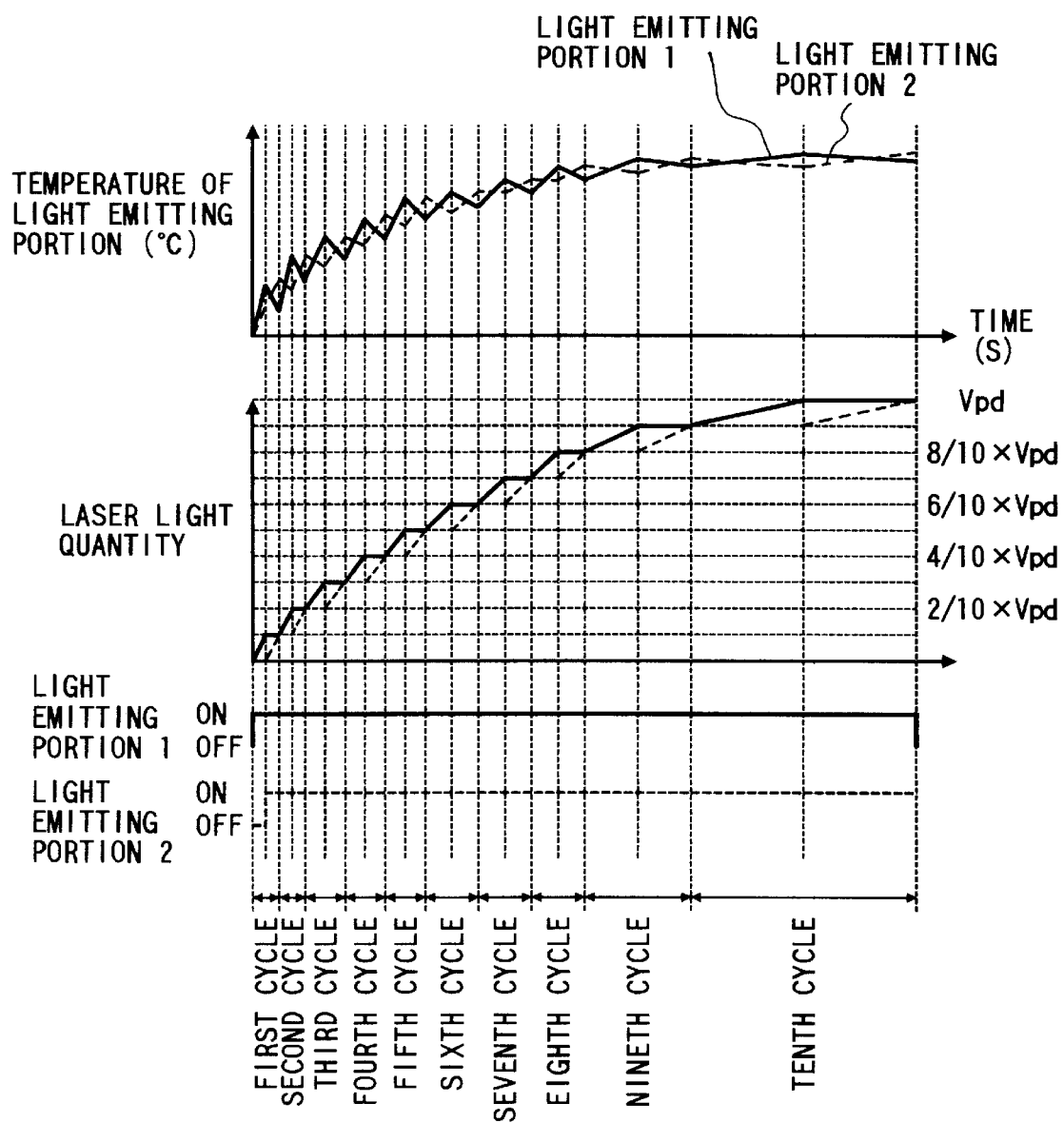
FIG. 23 is a graph showing changes in temperature of light emitting portions of the seventh embodiment.

FIGS. 21 and 22 are flow charts showing the control contents of this embodiment. Unlike in the fourth embodiment, both light emitting portions 1 and 2 do not cease to emit light upon completion of each cycle (delete the processing in steps S419, S420, S421, S436, S437, and S438 in FIG. 16). Upon completion of APC of each light emitting portion resets, the CPU 10 resets the coarse and fine adjustment output values from the D/A port to 0 (zero) (S701, S704), outputs them (S702, S705), and turns off the forced light emitting signal to cut the laser current supplied to the corresponding light emitting portion (S703, S706). FIG. 23 shows changes in temperature during the laser APC of this embodiment. In this embodiment, APC is made while light emitting portions 1 and 2 simultaneously emit light.

As described above, according to the present invention, since the light emitting portions have independent light quantity detection means, and the laser current to be supplied to the light emitting portion other than the one which is currently being subjected to the APC maintains the adjustment value during the previous adjustment cycle, the temperature of each light emitting portion can be prevented from falling in the non-adjustment state, and the temperature difference between the two light emitting portions can be reduced. For this reason, the influence of heat from the other light emitting portion during the APC can be nearly equalized in the two light emitting portions, and the output light quantity difference between the light emitting portions can be reduced.

An embodiment of a multi-line recording type image forming apparatus which uses the laser light quantity control device of the present invention and simultaneously records a plurality of lines will be described below.

Figure 32:
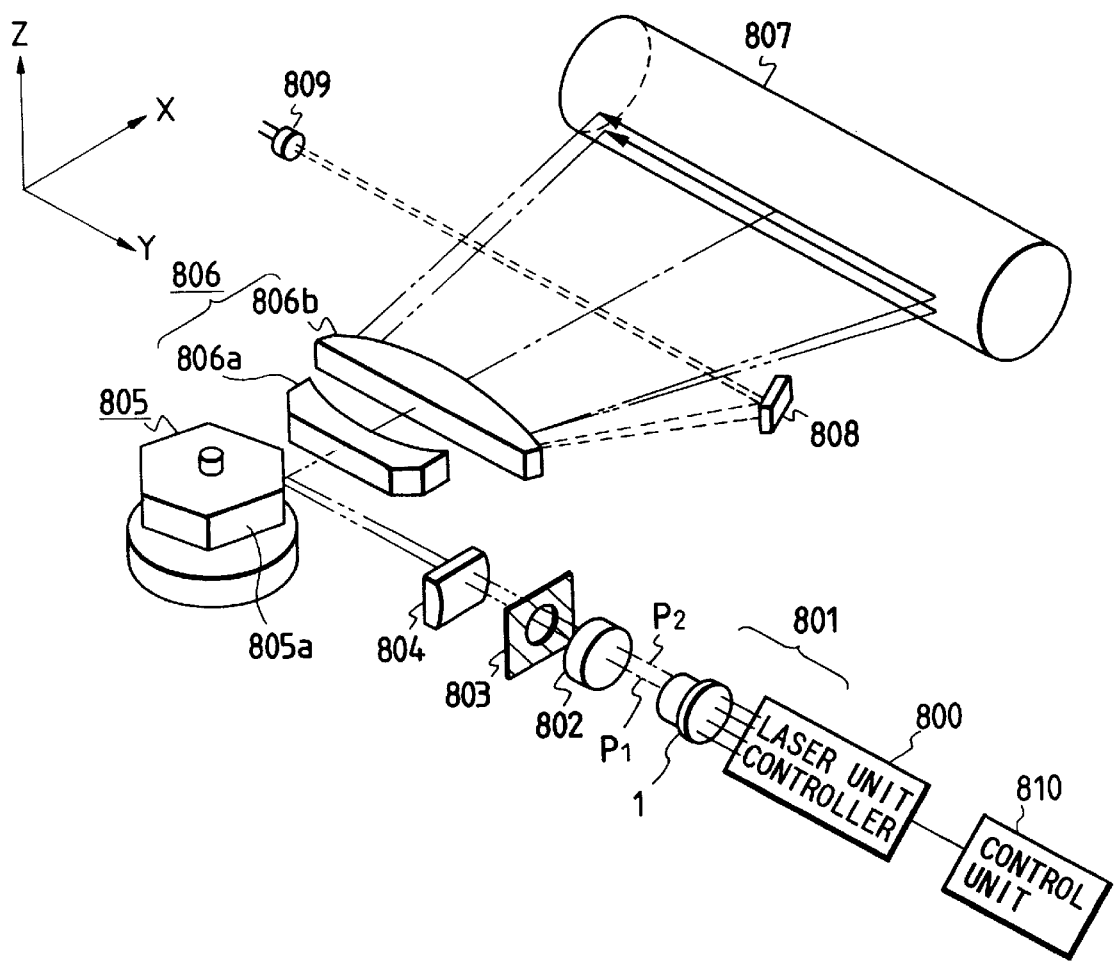
FIG. 32 is a view for explaining an embodiment of an image forming apparatus using a laser light quantity control device of the present invention.

This apparatus simultaneously scans a plurality of laser beams which are separated from each other. As shown in FIG. 32, a multi-beam semiconductor laser 801 produces two laser beams $P_1$ and $P_2$ which are modulated in correspondence signal video signals (VDO1, VDO2). After these laser beams are collimated by a collimator lens 802, the laser beams are irradiated onto each reflection surface 805a of a rotary polygonal mirror 805 via a stop 803 and a cylindrical lens 804, and are then imaged on a photosensitive body as a recording medium of a rotary drum 807 via an imaging lens system 806.

The two laser beams $P_1$ and $P_2$ are incident on each reflection surface 805a of the rotary polygonal mirror 805 while being separated in a direction (to be referred to a "Z-axis direction" hereinafter) along the rotation axis of the rotary polygonal mirror 805, and are respectively scanned in the main scanning direction (Y-axis direction) perpendicular to the Z-axis. Then, the two laser beams $P_1$ and $P_2$ form electrostatic latent images on the photosensitive body as a result of main scanning in the Y-axis direction upon rotation of the rotary polygonal mirror 805 and sub-scanning in the Z-axis direction upon rotation of the rotary drum 807.

Note that the cylindrical lens 804 has a function of preventing distortion of a point image formed on the photosensitive body by linearly bringing the laser beams $P_1$ and $P_2$ into a focus on the reflection surface 805a of the rotary polygonal mirror 805, as described above. Also, the imaging lens system 806 comprises a spherical lens 806a and a toric lens 806b, which have a function of preventing distortion of a point image formed on the photosensitive body as in the cylindrical lens 804, and a function of correcting the point image so that it is scanned at a constant velocity on the photosensitive body in the main scanning direction.

The two laser beams $P_1$ and $P_2$ are split in a direction below a main scanning plane (X-Y plane) by a detection mirror 807 at the end, in the Y-axis direction, of the main scanning plane, and enter a photosensor 809 at the side opposite to the mirror 807 across the main scanning plane. The two laser beams $P_1$ and $P_2$ are converted into write start signals which are transmitted to the semiconductor laser 801. Upon reception of the write start signals, the multi-beam semiconductor laser 801 starts write modulation of the two laser beams $P_1$ and $P_2$.

In this manner, when the write modulation timings of the two laser beams $P_1$ and $P_2$ are adjusted, the write start positions of electrostatic latent images to be formed on the photosensitive body can be controlled.

In the above-mentioned image forming apparatus, the APC of the semiconductor laser 801 is performed when the power switch of the apparatus is turned on, immediately before image formation on the photosensitive body in correspondence with video signals, and so on.

According to the present invention described above, since the APC of the light emitting portions is time-divisionally performed at predetermined time intervals, the influence of heat from the other light emitting portion during the APC can be nearly equalized in the two light emitting portions, and the output light quantity difference between the light emitting portions can be reduced.

Figure 24:
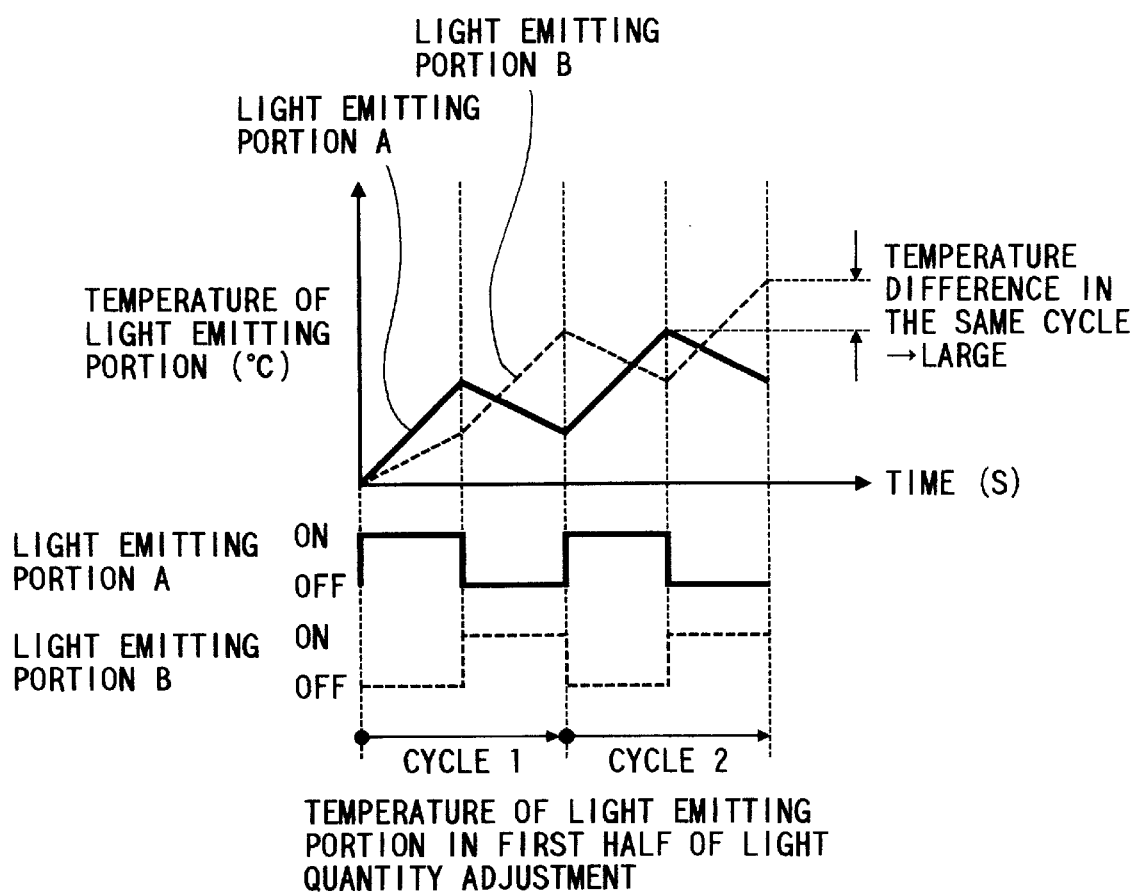
FIG. 24 is a graph for explaining the effect of the present invention.
Figure 25:
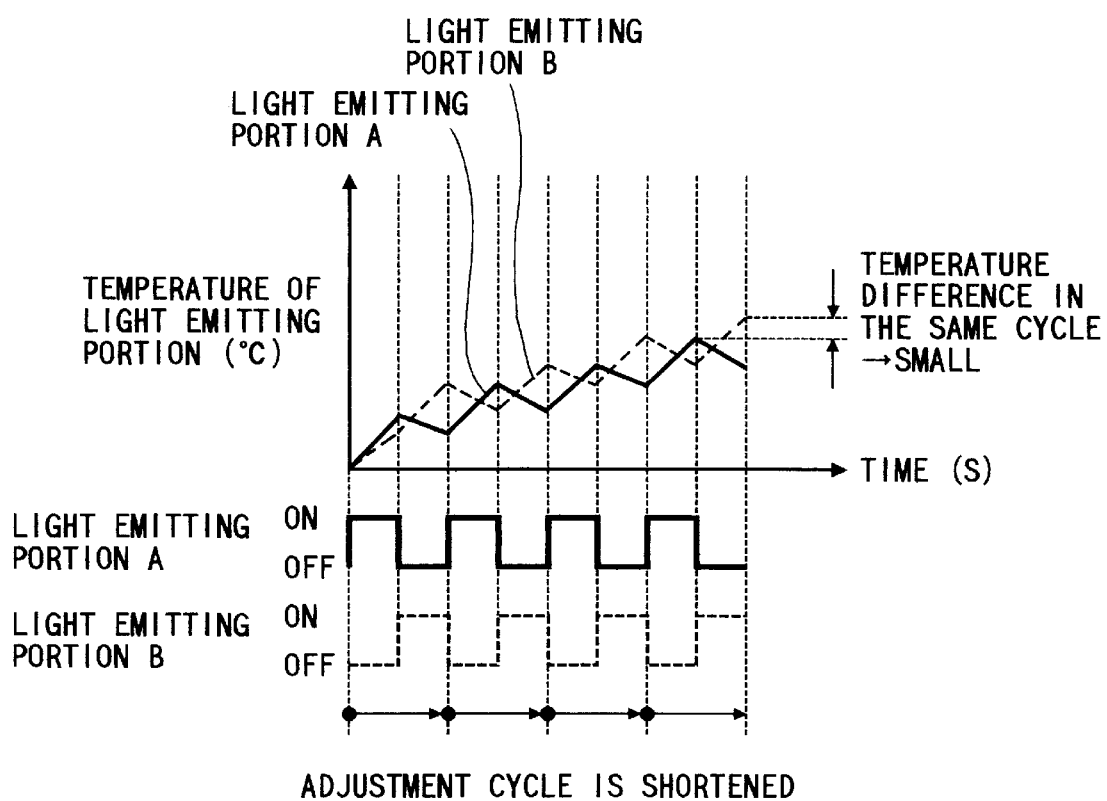
FIG. 25 is a graph for explaining the effect of the present invention.
Figure 26:
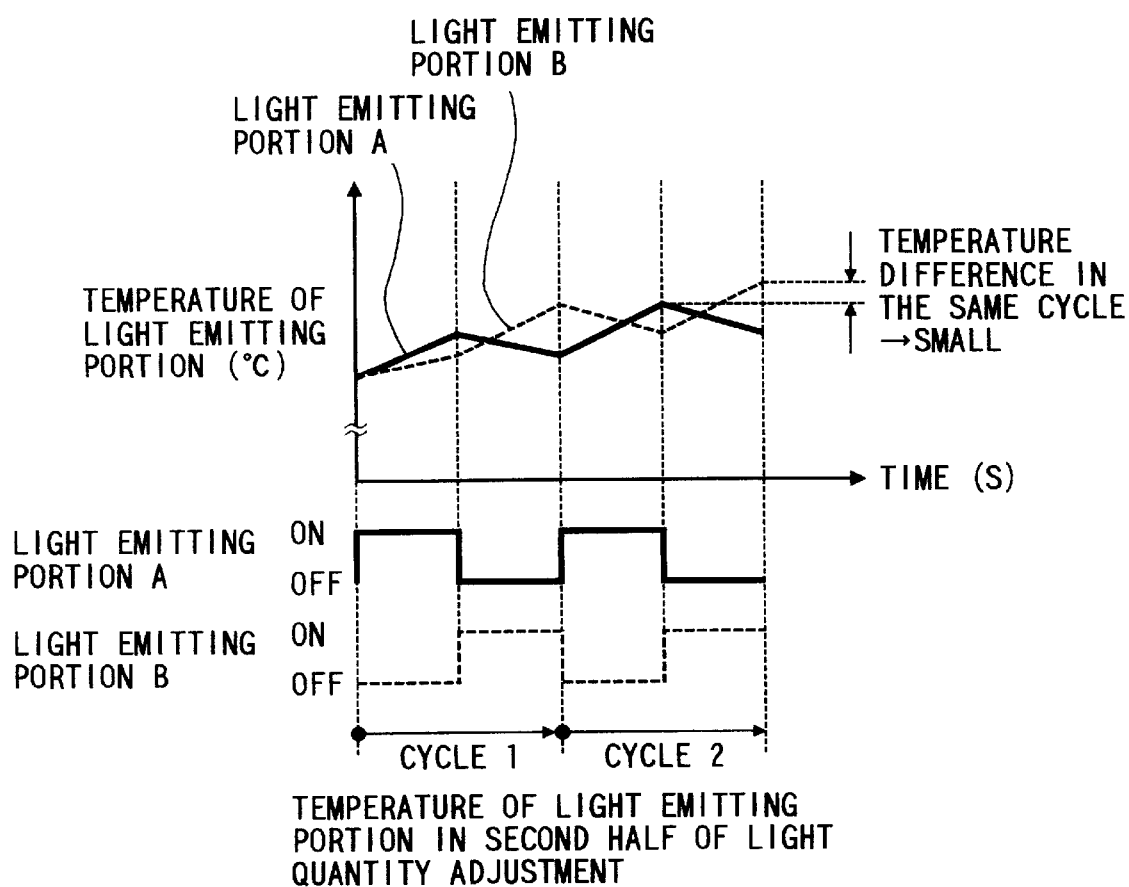
FIG. 26 is a graph for explaining the effect of the present invention.

As has been described in the second embodiment, when the time intervals of the APC to be executed time-divisionally are gradually prolonged, the light emitting interval can be shortened, as shown in FIG. 25, in the first half of the APC in which increases both in laser current and in quantity of heat produced are large, as shown in FIG. 24 (which exemplifies a laser array including two light emitting portions). For this reason, the temperature difference between the light emitting portions in the same cycle can be reduced. On the other hand, in the second half of the APC, even when the light emitting interval is long, since increases both in laser current and in quantity of heat produced are small, the temperature difference between the light emitting portions in the same cycle can be small, as shown in FIG. 26. As described above, even when a laser array with a large heat time constant due to a large heat resistance between the light emitting portions and a large heat capacity of the laser element itself is used, the influence of heat from the other light emitting portion during the APC can be nearly equalized in the two light emitting portions, and the output light quantity difference between the light emitting portions can be reduced.

Figure 27:
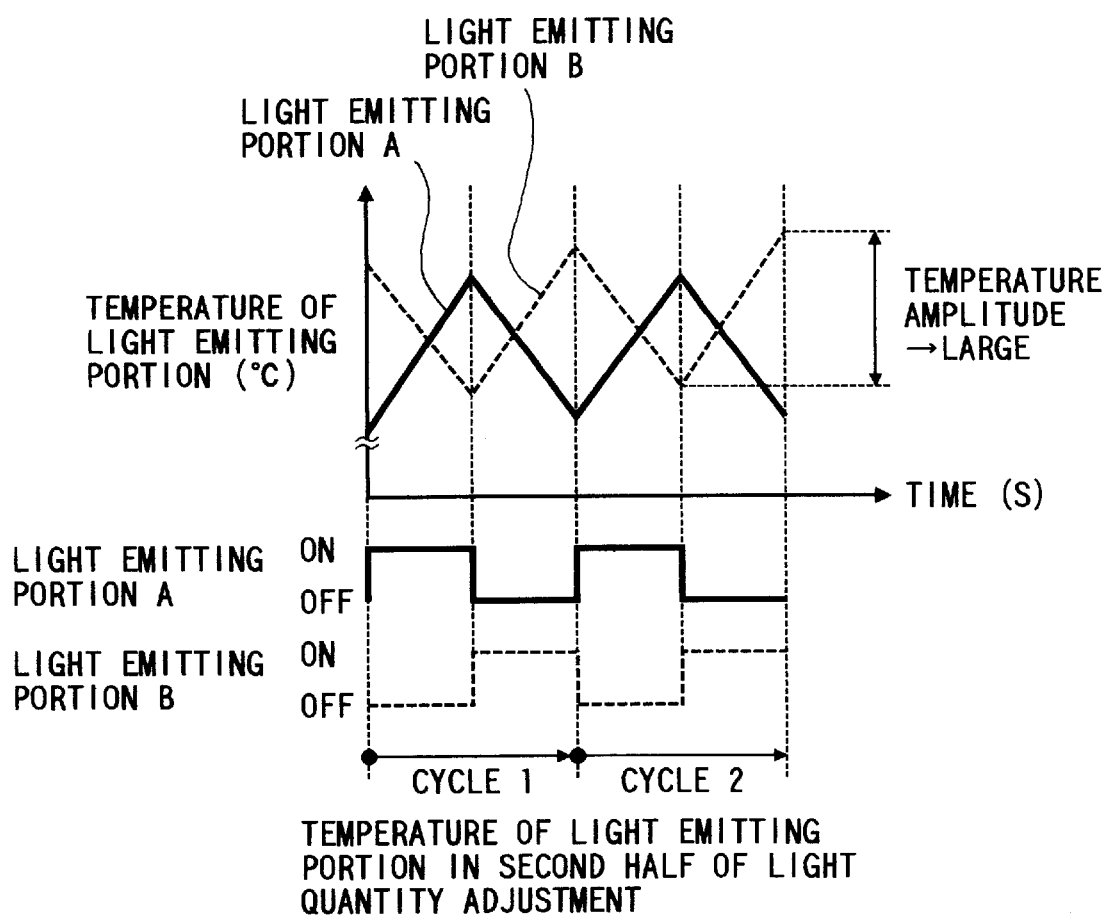
FIG. 27 is a graph for explaining the effect of the present invention.
Figure 28:
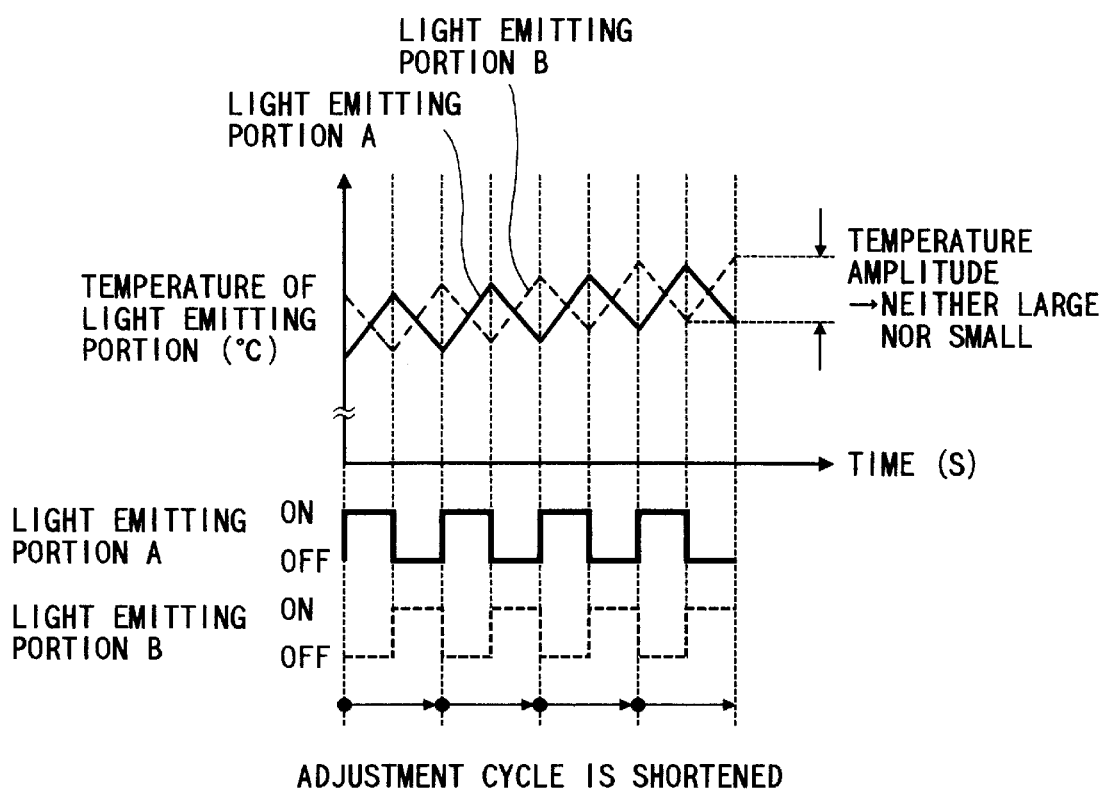
FIG. 28 is a graph for explaining the effect of the present invention.
Figure 29:
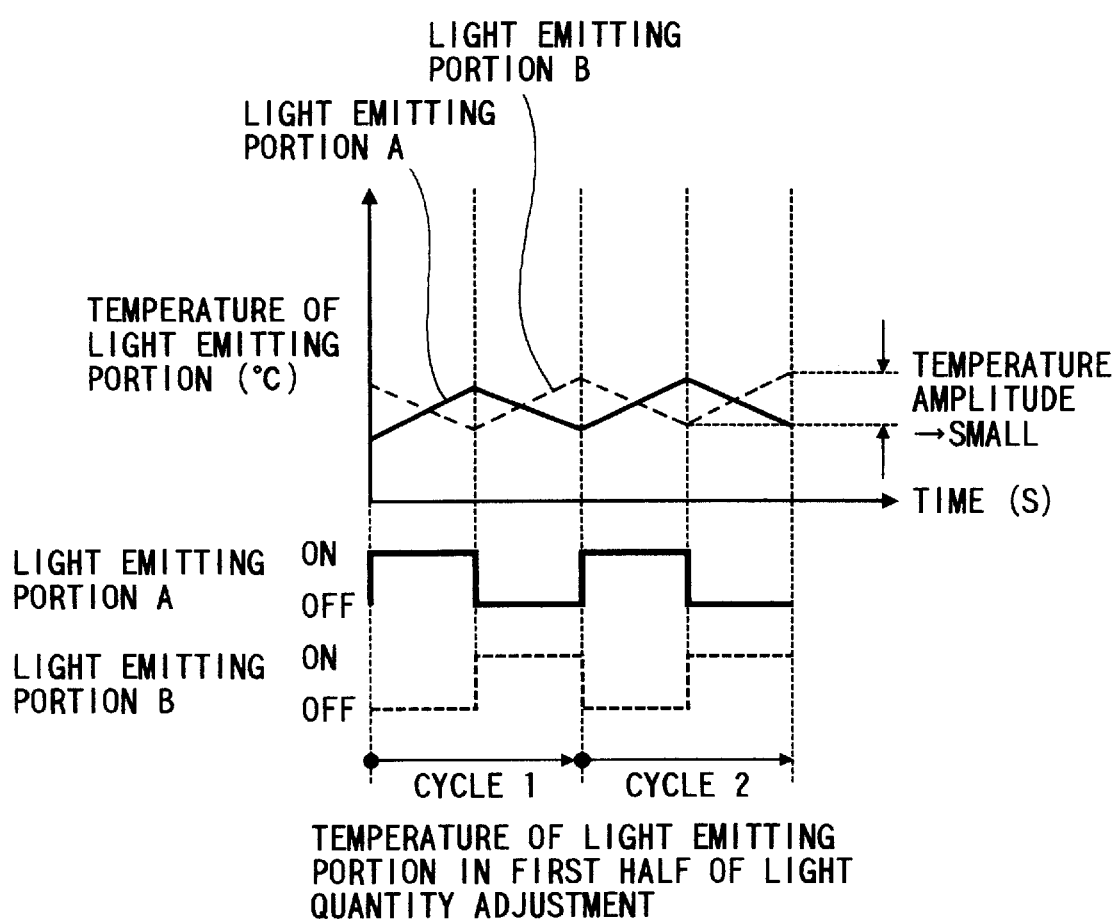
FIG. 29 is a graph for explaining the effect of the present invention.

As has been described in the third embodiment, when the time intervals of the APC to be executed time-divisionally are gradually shortened, the light emitting interval can be shortened, as shown in FIG. 28, in the second half of the APC in which both the laser current and quantity of heat produced are large, as shown in FIG. 27 (which exemplifies a laser array including two light emitting portions). For this reason, the temperature amplitude or the magnitude of temperature change in one cycle in the second half of the APC can be reduced, and variations in average temperature in one cycle can be suppressed. On the other hand, in the first half of the APC, even when the light emitting interval is long, since both the laser current and quantity of heat produced are small, the temperature amplitude within one cycle is small, as shown in FIG. 29. As described above, even when a laser element with a small heat capacity or a laser array with a small heat resistance between the laser element and the external environment is used, the influence of heat from the other light emitting portion during the APC can be nearly equalized in the two light emitting portions, and the output light quantity difference between the light emitting portions can be reduced.

Since a laser current is not supplied to the light emitting portion other than the one which is currently being subjected to the APC, even when the light quantity detection means is common to the individual light emitting portions, the influence of heat of the APC can be relaxed.

Figure 30:
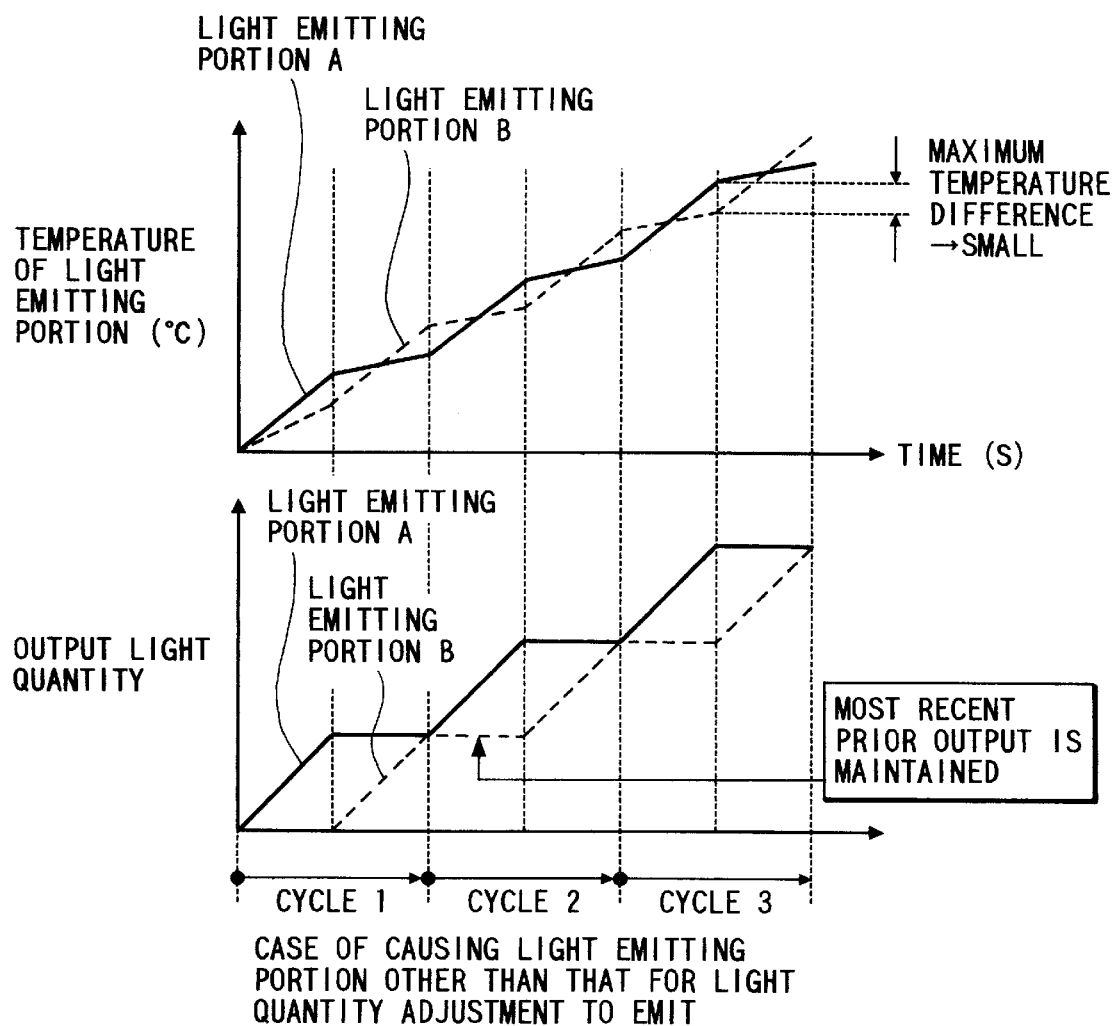
FIG. 30 is a graph for explaining the effect of the present invention.
Figure 31:
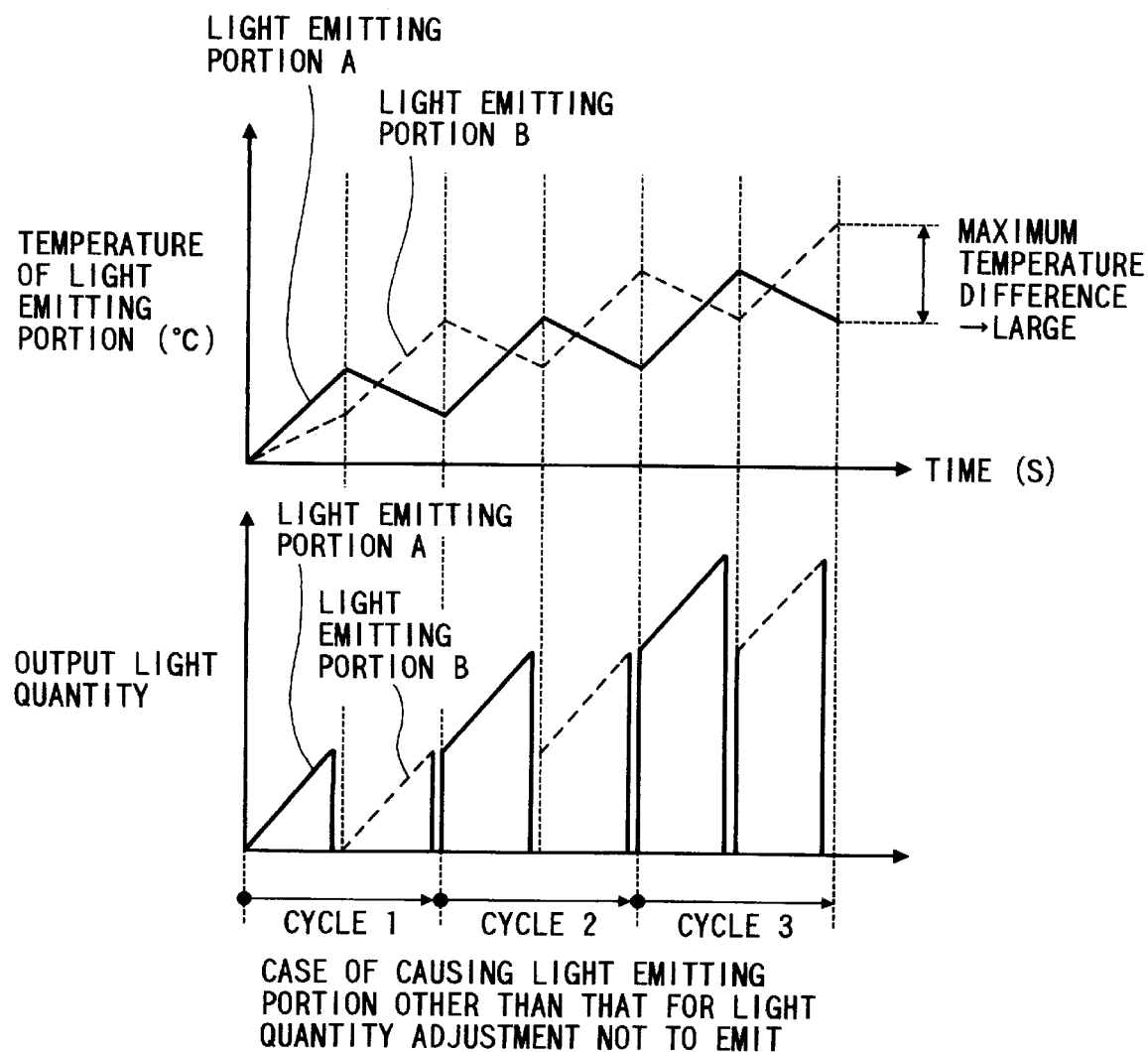
FIG. 31 is a graph for explaining the effect of the present invention.

As has been described in the seventh embodiment, since the light emitting portions have individual light quantity detection means, and the laser current to be supplied to the light emitting portion other than the one which is currently being subjected to the APC maintains the adjustment value in the previous adjustment cycle, the temperature difference between the light emitting portions (see FIG. 31) can be reduced by preventing drops in temperature of the light emitting portion in the non-adjustment state, as shown in FIG. 31, as compared to the temperature difference between the light emitting portions under the control in which only the light emitting portion which is currently being subjected to the APC emits light (see FIG. 30; which exemplifies a laser array including two light emitting portions). For this reason, the influence of heat from the other light emitting portion during the APC can be nearly equalized in the two light emitting portions, and the output light quantity difference between the light emitting portions can be reduced.

As has been described in the fourth embodiment, since a plurality of intermediate target light quantities are set at equal intervals before the target light quantity, and the light emitting portion to be subjected to adjustments is switched each time the laser light quantity reaches each intermediate target light quantity, the power consumption quantities of the individual light emitting portions in the single adjustment cycle can equal each other, the influence of heat from the other light emitting portion during the APC can be nearly equalized in the two light emitting portions, and the output light quantity difference between the light emitting portions can be reduced.

As has been described in the fifth embodiment, since the intervals of the intermediate target light quantity value are gradually prolonged as the light quantity increases, even when a laser array with a large heat time constant due to a large heat resistance between the light emitting portions or a large heat capacity of the laser element itself is used, the influence of heat from the other light emitting portion during the APC can be nearly equalized in the two light emitting portions, and the output light quantity difference between the light emitting portions can be reduced.

As has been described in the sixth embodiment, since the intervals of the intermediate target light quantity value are gradually shortened as the light quantity increases, even when a laser element with a small heat capacity or a laser array with a small heat resistance between the laser element and the external environment is used, the influence of heat from the other light emitting portion during the APC can be nearly equalized in the two light emitting portions, and the output light quantity difference between the light emitting portions can be reduced.

Also, according to the image forming apparatus using the laser light quantity control device of the present invention, since the influence of heat on the light emitting portions in the semiconductor laser element can be relaxed, the image quality can be improved.

What is claimed is:

1. A laser light quantity control device comprising:
    a semiconductor laser element having a plurality of light emitting portions;
    light quantity detection means for detecting light quantities of the individual light emitting portions; and
    light quantity adjustment means for controlling currents to be supplied to the individual light emitting portions on the basis of outputs from said light quantity detection means, said light quantity adjustment means time-divisionally performing light quantity adjustments of the individual light emitting portions alternately during each of a plurality of predetermined time intervals.

2. A device according to claim 1, wherein said light quantity adjustment means gradually prolongs the time intervals of the light quantity adjustments to be performed time-divisionally.

3. A device according to claim 1, wherein said light quantity adjustment means gradually shortens the time intervals of the light quantity adjustments to be performed time-divisionally.

4. A device according to claim 1, wherein when said light quantity adjustment means performs the light quantity adjustments, a laser current is supplied to only one of the light emitting portions, and is not supplied to other light emitting portions.

5. A device according to claim 1, wherein a plurality of light quantity adjustment means equivalent to said light quantity adjustment means are arranged, and laser currents supplied to the light emitting portions, which are not being subjected to the light amount adjustments, maintain adjustment values in previous adjustment cycles.

6. A laser light quantity control device comprising:
    a semiconductor laser element having a plurality of light emitting portions;
    light quantity detection means for detecting light quantities of the individual light emitting portions; and
    light quantity adjustment means for controlling currents to be supplied to the individual light emitting portions on the basis of outputs from said light quantity detection means, said light quantity adjustment means performing light quantity adjustments of the individual light emitting portions by alternately switching the light emitting portions during each of a plurality of predetermined time intervals, for gradually raising the light quantities of the individual light emitting portions to a target light quantity.

7. A device according to claim 6, wherein said light quantity adjustment means sets a plurality of intermediate target light quantities before the target light quantity, alternately switches the light emitting being subjected to the light quantity adjustments each time the laser light quantity of the light emitting portion reaches a respective one of the intermediate target light quantities, and gradually raises the light quantities of the individual light emitting portions to the target light quantity.

8. A device according to claim 7, wherein said light quantity adjustment means gradually prolongs the predetermined time intervals associated with the plurality of intermediate target light quantities as the light quantity increases.

9. A device according to claim 7, wherein said light quantity adjustment means gradually shortens the predetermined time intervals associated with the plurality of intermediate target light quantities as the light quantity increases.

10. A device according to claim 6, wherein when said light quantity adjustment means performs the light quantity adjustments, a laser current is supplied to only one of the light emitting portions, and is not supplied to other light emitting portions.

11. A device according to claim 6, wherein a plurality of light quantity adjustment means equivalent to said light quantity adjustment means are arranged, and laser currents supplied to the light emitting portions, which are not being subjected to the light amount adjustments, maintain adjustment values in previous adjustment cycles.

12. A method of adjusting light quantities of light emitting portions of a semiconductor laser element having a plurality of light emitting portions, comprising the steps of:

providing a semiconductor laser element having a plurality of light emitting portions; and performing light quantity adjustments of the individual light emitting portions by alternately switching the light emitting portions during each of a plurality of predetermined time intervals, for gradually raising the light quantities of the individual light emitting portions to a target light quantity.

13. A method according to claim 12, wherein when the light quantity adjustments are performed, a laser current is supplied to only one of the light emitting portions, and is not supplied to other light emitting portions.

14. A method according to claim 12, wherein when the light quantity adjustments are performed, laser currents supplied to the light emitting portions, which are not being subjected to the light amount adjustments, maintain adjustment values in previous adjustment cycles.

15. A method of adjusting light quantities of light emitting portions of a semiconductor laser element having a plurality of light emitting portions to a target light quantity, comprising the steps of:

providing a semiconductor laser element having a plurality of light emitting portions; and setting a plurality of intermediate target light quantities before the target light quantity; and alternately switching the light emitting portions during each of a plurality of predetermined time intervals, the switching also being performed so that the light emitting portion being subjected to the light quantity adjustment is switched each time the light quantity of the light emitting portion reaches a respective one of the intermediate target light quantities, for gradually raising the light quantities of the individual light emitting portions to the target light quantity.

16. A method according to claim 15, wherein the predetermined time intervals are associated with the plurality of intermediate target light quantities and are gradually prolonged as the light quantity increases.

17. A method according to claim 15, wherein the predetermined time intervals are associated with the plurality of intermediate target light quantities and are gradually shortened as the light quantity increases.

18. An image forming apparatus comprising:

a semiconductor laser element having a plurality of light emitting portions;

light quantity detection means for detecting light quantities of the individual light emitting portions;

light quantity adjustment means for controlling currents to be supplied to the individual light emitting portions on the basis of outputs from said light quantity detection means, said light quantity adjustment means time-divisionally performing light quantity adjustments of the individual light emitting portions alternately during each of a plurality of predetermined time intervals;

scanning means for scanning a plurality of laser beams from said semiconductor laser element; and a recording medium on which an image is formed by the plurality of laser beams.

19. An apparatus according to claim 18, wherein said light quantity adjustment means gradually prolongs the time intervals of the light quantity adjustments to be performed time-divisionally.

20. An apparatus according to claim 18, wherein said light quantity adjustment means gradually shortens the time intervals of the light quantity adjustments to be performed time-divisionally.

21. An apparatus according to claim 18, wherein when said light quantity adjustment means performs the light quantity adjustments, a laser current is supplied to only one of the light emitting portions, and is not supplied to other light emitting portions.

22. An apparatus according to claim 18, wherein a plurality of light quantity adjustment means equivalent to said light quantity adjustment means are arranged, and laser currents supplied to the light emitting portions, which are not being subjected to the light amount adjustments, maintain adjustment values in previous adjustment cycles.

23. An image forming apparatus comprising:

a semiconductor laser element having a plurality of light emitting portions;

light quantity detection means for detecting light quantities of the individual light emitting portions;

light quantity adjustment means for controlling currents to be supplied to the individual light emitting portions on the basis of outputs from said light quantity detection means, said light quantity adjustment means performing light quantity adjustments of the individual light emitting portions by alternately switching the light emitting portions during each of a plurality of predetermined time intervals, for gradually raising the light quantities of the individual light emitting portions to a target light quantity;

scanning means for scanning a plurality of laser beams from said semiconductor laser element; and a recording medium on which an image is formed by the plurality of laser beams.

24. An apparatus according to claim 23, wherein said light quantity adjustment means sets a plurality of intermediate target light quantities before the target light quantity, switches the light emitting portion being subjected to the light quantity adjustments each time the laser light quantity of the light emitting portion reaches a respective one of the intermediate target light quantities, and gradually raises the light quantities of the individual light emitting portions to the target light quantity.

25. An apparatus according to claim 24, wherein said light quantity adjustment means gradually prolongs the predetermined time intervals associated with the plurality of intermediate target light quantities as the light quantity increases.

26. An apparatus according to claim 24, wherein said light quantity adjustment means gradually shortens the predetermined time intervals associated with the plurality of intermediate target light quantities as the light quantity increases.

27. An apparatus according to claim 23, wherein when said light quantity adjustment means performs the light quantity adjustments, a laser current is supplied to only one of the light emitting portions, and is not supplied to other light emitting portions.

28. An apparatus according to claim 23, wherein a plurality of light quantity adjustment means equivalent to said light quantity adjustment means are arranged, and laser currents supplied to the light emitting portions, which are not being subjected to the light amount adjustments, maintain adjustment values in previous adjustment cycles.

29. A device according to claim 1, wherein said light quantity detection means comprises a single detection portion.

30. A device according to claim 6, wherein said light quantity detection means comprises a single detection portion.

31. An apparatus according to claim 18, wherein said light quantity detection means comprises a single detection portion.

32. An apparatus according to claim 23, wherein said light quantity detection means comprises a single detection portion.

* * * * *